(12) United States Patent
Fujita et al.

(10) Patent No.: US 11,915,914 B2
(45) Date of Patent: Feb. 27, 2024

(54) FILM FORMING METHOD AND FILM FORMING APPARATUS

(71) Applicant: Tokyo Electron Limited, Tokyo (JP)

(72) Inventors: Sena Fujita, Nirasaki (JP); Hiroki Murakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/051,097

(22) Filed: Oct. 31, 2022

(65) Prior Publication Data

US 2023/0135342 A1    May 4, 2023

(30) Foreign Application Priority Data

Nov. 2, 2021 (JP) .................................. 2021-179687
Sep. 15, 2022 (JP) .................................. 2022-147033

(51) Int. Cl.
| | |
|---|---|
| C23C 16/08 | (2006.01) |
| C23C 16/34 | (2006.01) |
| C23C 16/40 | (2006.01) |
| C23C 16/455 | (2006.01) |
| C23C 16/505 | (2006.01) |
| C23C 16/52 | (2006.01) |
| H01J 37/32 | (2006.01) |
| H01L 21/02 | (2006.01) |
| H01L 21/32 | (2006.01) |

(52) U.S. Cl.
CPC ........ *H01J 37/32449* (2013.01); *C23C 16/08* (2013.01); *C23C 16/34* (2013.01); *C23C 16/405* (2013.01); *C23C 16/45529* (2013.01); *C23C 16/45536* (2013.01); *C23C 16/45542* (2013.01); *C23C 16/505* (2013.01); *C23C 16/52* (2013.01); *H01L 21/02112* (2013.01); *H01L 21/02274* (2013.01); *H01L 21/0228* (2013.01); *H01L 21/32* (2013.01)

(58) Field of Classification Search
None
See application file for complete search history.

(56) References Cited

U.S. PATENT DOCUMENTS

| | | | |
|---|---|---|---|
| 6,576,053 B1 * | 6/2003 | Kim .................. | H01L 21/02181 257/E21.271 |
| 2018/0080121 A1 * | 3/2018 | Longrie ................. | C23C 16/56 |
| 2021/0098257 A1 * | 4/2021 | Sharma ............... | H01L 21/6831 |
| 2022/0181144 A1 * | 6/2022 | Kawano ............. | H01L 21/0215 |
| 2022/0199401 A1 * | 6/2022 | Lin ......................... | C23C 16/30 |

FOREIGN PATENT DOCUMENTS

| | | | | |
|---|---|---|---|---|
| JP | 2017-174919 A | | 9/2017 | |
| WO | WO-2020195903 A1 * | | 10/2020 | ....... C23C 16/45544 |

\* cited by examiner

*Primary Examiner* — Jose I Hernandez-Kenney
(74) *Attorney, Agent, or Firm* — Armstrong Teasdale LLP

(57) ABSTRACT

A film forming method includes: preparing a substrate having a surface on which a first film containing boron and a second film made of a material different from that of the first film are formed; supplying a raw material gas, which contains halogen and an element X other than halogen, to the surface of the substrate; and supplying a plasmarized reaction gas, which contains oxygen, to the surface of the substrate, wherein a third film as an oxide film of the element X is selectively formed on the second film with respect to the first film by alternately supplying the raw material gas and the plasmarized reaction gas.

24 Claims, 34 Drawing Sheets

FILM FORMING METHOD AND FILM FORMING APPARATUS

CROSS-REFERENCE TO RELATED APPLICATIONS

This application is based upon and claims the benefit of priority from Japanese Patent Application No. 2021-179687, filed on Nov. 2, 2021, and Japanese Patent Application No. 2022-147033, filed on Sep. 15, 2022, the entire contents of which are incorporated herein by reference.

TECHNICAL FIELD

The present disclosure relates to a film forming method and a film forming apparatus.

BACKGROUND

A method of forming a nitride film, which is described in Patent Document 1, includes a process of adsorbing a chlorine gas on surfaces of a first base film and a second base film, and a process of selectively forming a nitride film on one of the first base film and the second base film on which the chlorine gas is adsorbed.

PRIOR ART DOCUMENTS

Patent Documents

Patent Document 1: Japanese Patent Laid-Open Publication No. 2017-174919

SUMMARY

According to one embodiment of the present disclosure, there is provided a film forming method including: preparing a substrate having a surface on which a first film containing boron and a second film made of a material different from that of the first film are formed; supplying a raw material gas, which contains halogen and an element X other than halogen, to the surface of the substrate; and supplying a plasmarized reaction gas, which contains oxygen, to the surface of the substrate, wherein a third film as an oxide film of the element X is selectively formed on the second film with respect to the first film by alternately supplying the raw material gas and the plasmarized reaction gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
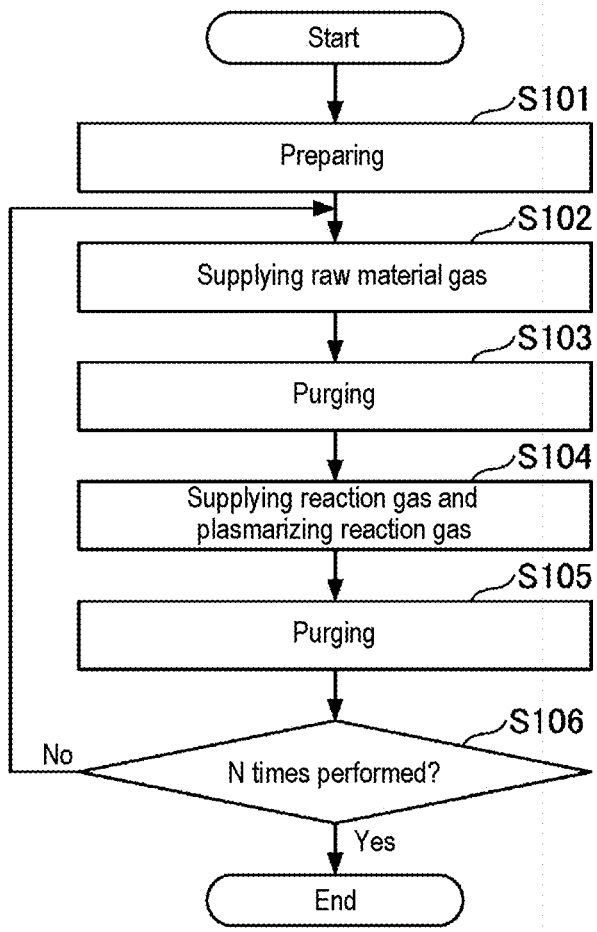
FIG. 1 is a flowchart showing a film forming method according to one embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. Throughout the drawings, the same or corresponding constituent elements are denoted by the same reference numerals, and explanations thereof may be omitted.

First, a film forming method according to one embodiment will be described with reference to FIG. 1. The film forming method includes, for example, steps S101 to S106 shown in FIG. 1. Note that the film forming method may include at least steps S101, S102, and S104. The order of steps S102 and S104 may be reversed, and step S104 may be performed before step S102. The film forming method may include steps other than steps S101 to S106 shown in FIG. 1.

Figure 2:
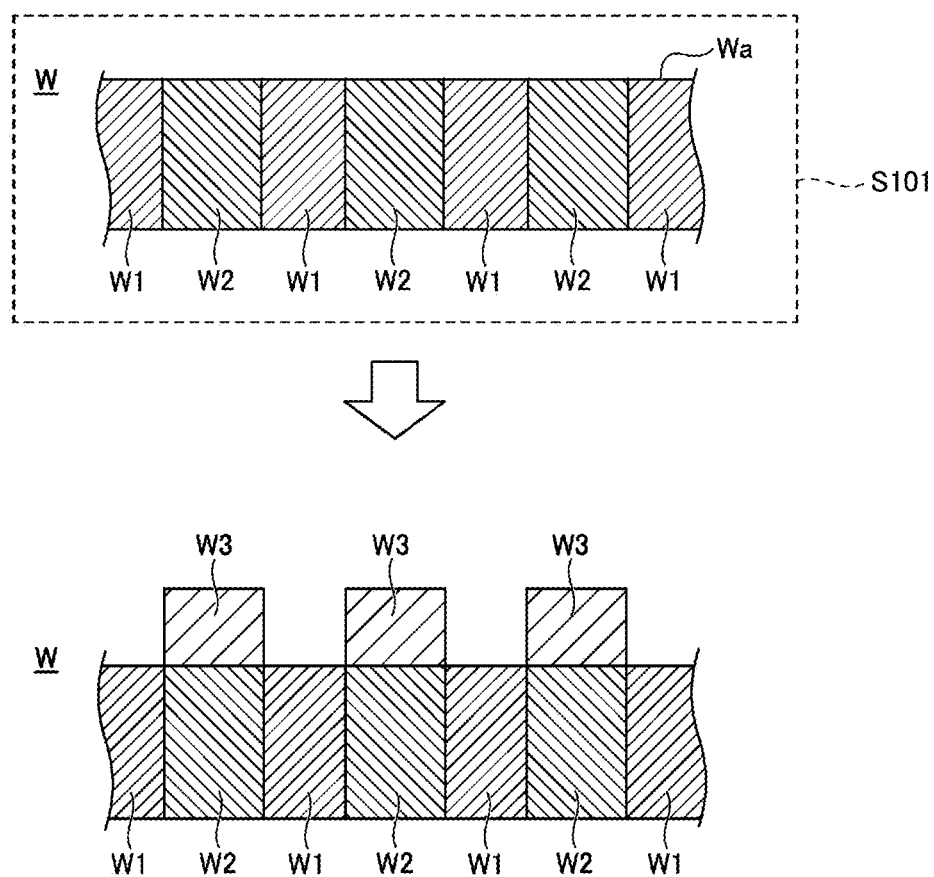
FIG. 2 is a view showing a first example of a substrate prepared in step S101.

Step S101 of FIG. 1 includes preparing a substrate W (see FIG. 2). The substrate W has a first film W1 and a second film W2 on a surface Wa of the substrate W. The first film W1 and the second film W2 are formed, for example, on a base substrate (not shown). The base substrate is a silicon wafer or a compound semiconductor wafer. The compound semiconductor wafers are, for example, a GaAs wafer, a SiC wafer, a GaN wafer, or an InP wafer.

The first film W1 contains boron (B). A boron (B) content in the first film W1 is, for example, 20 atom % to 100 atom %, specifically 40 atom % to 100 atom %. The first film W1 is, for example, a B film, a BN film, a BNC film, a BO film, a BNOC film, a SiBN film, a SiBCN film, or a SiOBN film. Here, the BN film means a film containing boron (B) and nitrogen (N). An atomic ratio of B and N in the BN film is not limited to 1:1. The BNC film and the like other than the BN film also mean including individual elements in the same manner, and are not limited to the stoichiometric ratio.

The second film W2 is made of a material different from that of the first film W1. The second film W2 contains substantially no B. "Containing substantially no B" means that a boron (B) content is 0 atom % to 5 atom %. It is more desirable as the boron (B) content in the second film W2 decreases. The second film W2 may be any one of an insulating film, a conductive film, and a semiconductor film.

The insulating film is not particularly limited, but is, for example, a SiO film, a SiN film, a SiOC film, a SiON film, a SiOCN film, an AlO film, a ZrO film, a HfO film, or a TiO film. Here, the SiO film means a film containing silicon (Si) and oxygen (O). An atomic ratio of Si and O in the SiO film is usually 1:2, but is not limited to 1:2. The SiN film, the SiOC film, the SiON film, the SiOCN film, the AlO film, the ZrO film, the HfO film, and the TiO film also mean containing individual elements, and are not limited to the stoichiometric ratio. The insulating film is, for example, an interlayer insulating film. The interlayer insulating film is desirably a low dielectric constant (low-k) film.

The semiconductor film is not particularly limited, but is, for example, a Si film, a SiGe film, or a GaN film. The semiconductor film may be any one of a monocrystalline film, a polycrystalline film, or an amorphous film.

The conductive film is, for example, a metal film. The metal film is not particularly limited, but is, for example, a Cu film, a Co film, a Ru film, a Mo film, a W film, or a Ti film. The conductive film may be a metal nitride film. The metal nitride film is not particularly limited, but it may be, for example, a TiN film or a TaN film. Here, the TiN film means a film containing titanium (Ti) and nitrogen (N). An atomic ratio of Ti and N in the TiN film is usually 1:1, but is not limited to 1:1. The TaN film also means containing individual elements, and is not limited to the stoichiometric ratio.

Step S102 of FIG. 1 includes supplying a raw material gas to the surface Wa of the substrate W. The raw material gas contains a halogen element and an element X other than the halogen element. The halogen element is fluorine, chlorine, bromine, or iodine. The element X is not particularly limited as long as it is oxidized in step S104, but is desirably a metal element, more specifically a transition metal element. The transition metal element is, for example, Ti, W, V, Al, Mo, Sn, or Hf Specific examples of the raw material gas may include $TiCl_4$ gas, $WCl_6$ gas, $VCl_4$ gas, $AlCl_3$ gas, $MoCl_5$ gas, $SnCl_4$ gas, and $HfCl_4$ gas. The element X may be a semiconductor element, in particular Si or Ge. The raw material gas is a silicon halide gas or a germanium halide gas. Specific examples of the silicon halide gas may include $SiCl_4$ gas, $SiHCl_3$ gas, $SiH_2Cl_2$ gas, $SiH_3Cl$ gas, $Si_2Cl_6$ gas, $Si_2HCl_5$ gas, $SiH_2I_2$ gas, $SiCl_3CH_3$ gas, and the like. Specific examples of the germanium halide gas may include $GeCl_4$ gas and the like. The raw material gas may be supplied together with a dilution gas. The dilution gas is, for example, Ar gas or $N_2$ gas.

Step S103 of FIG. 1 includes supplying a purge gas to the surface Wa of the substrate W. The purge gas purges the excessive raw material gas that has not been adsorbed to the surface Wa of the substrate W in step S102. As the purge gas, for example, a rare gas such as Ar gas or $N_2$ gas is used.

Step S104 of FIG. 1 includes supplying a reaction gas to the surface Wa of the substrate W. Step S104 includes plasmarizing the reaction gas and supplying the plasmarized reaction gas to the surface Wa of the substrate W. The reaction gas contains oxygen and oxidizes the element X contained in the adsorbed raw material gas to form a third film W3 as an oxide film of the element X (see FIG. 2). The reaction gas is, for example, $O_2$ gas, $O_3$ gas), $CO_2$ gas, $N_2O$ gas, NO gas, or $H_2O$ gas. The reaction gas may be supplied together with a dilution gas. The dilution gas is, for example, Ar gas or $N_2$ gas.

Note that the reaction gas may be supplied not only in step S104 but also in all of steps S102 to S105. However, plasmarizing the reaction gas is performed in step S104 only. The reason is because, by being plasmarized, the reaction gas becomes more likely to react with the raw material gas adsorbed on the surface Wa of the substrate W.

Step S105 of FIG. 1 includes supplying a purge gas to the surface Wa of the substrate W. The purge gas purges the excessive reaction gas that has not reacted with the surface Wa of the substrate W in step S104. As the purge gas, for example, a rare gas such as Ar gas or $N_2$ gas is used.

In step S106 in FIG. 1, it is determined whether or not steps S102 to S105 have been performed N times (N is an integer of one or more). N may be an integer of two or more, and steps S102 to S105 may be repeatedly performed. A film thickness of the third film W3 may be increased.

When an execution number of steps S102 to S105 is less than N times ("NO" in step S106), the film thickness of the third film W3 is less than a target value. Thus, steps S102 to S105 are performed again. N is desirably 200 or more, more specifically 300 or more. N is desirably 1,000 or less.

On the other hand, when the execution number of steps S102 to S105 reaches N times ("YES" in step S106), the film thickness of the third film W3 has reached the target value. Thus, the current process ends.

According to the present embodiment, the third film W3 is selectively formed on the second film W2 with respect to the first film W1 by a plasma atomic layer deposition (ALD) method. In order to selectively form the third film W3, it is important to desorb the raw material gas, which is weakly adsorbed on the first film W1, without advancing a film forming reaction (formation of the third film W3) by collision or reaction with the plasmarized reaction gas.

Easiness of desorbing the raw material gas adsorbed on the first film W1 varies according to a strength of adsorption of the raw material gas on the first film W1, and thus varies according to a material of the first film W1. The easiness of desorbing the raw material gas adsorbed on the first film W1 varies according to whether or not the raw material gas is dissociated by reaction with atoms on the surface of the first film W1 and becomes molecules that are easily oxidized in subsequent reactions. It is considered that on the first film W1 containing boron, compared to the second film W2 containing substantially no boron, adsorption of the halide, which is the raw material gas, is weak or does not occur, or dissociation of the halide is difficult to occur.

Oxygen ions or oxygen radicals are generated by plasmarizing the reaction gas containing oxygen. The oxygen ions are accelerated by a potential of the plasma and collide with the substrate W. It is considered that collision of the accelerated oxygen ions or oxygen radicals causes sputtering that physically knocks off a substance on the surface Wa. Alternatively, it is considered that the oxygen ions or oxygen radicals chemically react with the substance on the surface Wa to form a film.

The halide adsorbed on the second film W2 containing substantially no boron is either strongly adsorbed or dissociated into easily oxidizable molecules, and thus, is easily oxidized by collision with the oxygen ions or oxygen radicals. Therefore, it is considered that formation of an oxide film proceeds on the second film W2. On the other hand, the halide adsorbed on the first film W1 containing boron is either weakly adsorbed or not dissociated into easily oxidizable molecules, and thus, is knocked off by the collision of the oxygen ions or oxygen radicals. Therefore, it is considered that the formation of the oxide film does not proceed on the first film W1.

It is also considered that the reason why the formation of the oxide film does not proceed on the first film W1 is because the halide is desorbed by sputtering or chemical reaction, or the first film W1 is etched by the collision of the oxygen ions or oxygen radicals to cause the halide to lift off.

Figure 32:
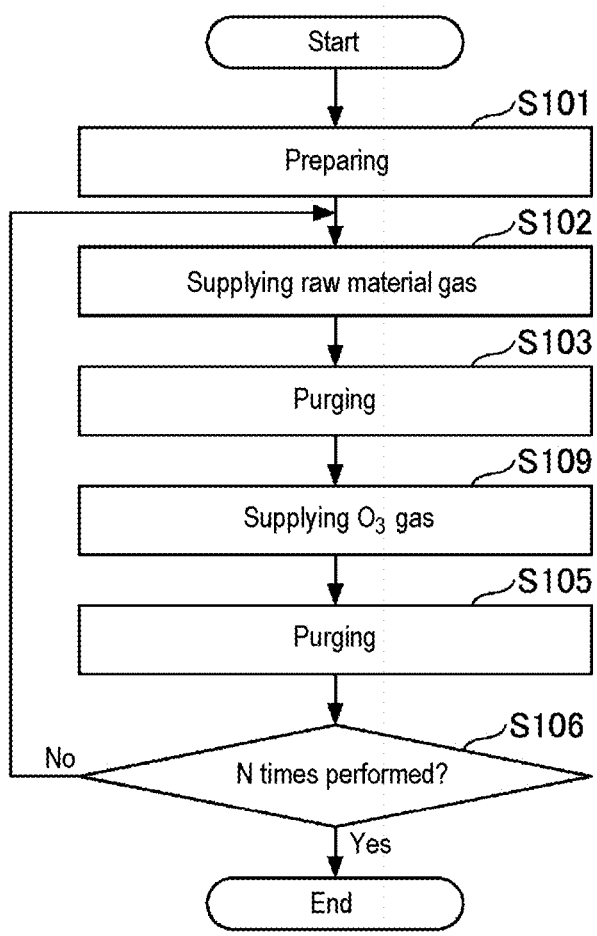
FIG. 32 is a flowchart showing a film forming method according to a second modification.

Further, as shown in FIG. 32, step S109 may be performed instead of step S104. Step S109 includes supplying $O_3$ gas) to the surface Wa of the substrate W without plasmarizing the $O_3$ gas). Since the $O_3$ gas) is supplied without being plasmarized, it does not initially contain oxygen ions and oxygen radicals. The $O_3$ gas) collides with the surface Wa of the heated substrate W to generate oxygen radicals. The oxygen radicals oxidize the halide adsorbed on the second film W2 containing substantially no boron, and formation of an oxide film proceeds. On the other hand, the halide adsorbed on the first film W1 containing boron is knocked off, and the formation of the oxide film does not proceed.

Further, even when a reaction gas containing no oxygen, such as $H_2$ gas or $NH_3$ gas, is plasmarized, active species such as ions or radicals are also generated, but these active species facilitate the film forming reaction. Therefore, it is considered that when the reaction gas containing no oxygen is used, the film forming reaction is likely to proceed not only on the second film W2 but also on the first film W1, resulting in loss of selectivity. Therefore, a gas containing oxygen is appropriate as a gas to be plasmarized.

Further, the halide adsorbed on the first film W1 is less likely to be decomposed by the collision with the oxygen ions or oxygen radicals. For example, the halide such as $TiCl_4$ are less likely to be decomposed by the collision with the oxygen ions or oxygen radicals than an organometallic complex such as $Ti[N(CH_3)_2]_4$. In order to desorb the halide adsorbed on the first film W1 from the first film W1, it is important that the halide is difficult to be decomposed by the collision with the oxygen ions or oxygen radicals and by heat from the substrate. Therefore, a gas containing halogen is appropriate as the raw material gas.

Further, in a plasma chemical vapor deposition (CVD) method in which both halide and oxygen are plasmarized, active species such as ions or radicals generated by dissociation of the halide are generated in addition to oxygen ions or oxygen radicals. It is considered that since the active species generated from the halide has high reactivity, the film forming reaction is likely to proceed not only on the second film W2 but also on the first film W1, resulting loss of selectivity. It is important to use a plasma ALD method in order to produce the selectivity.

In steps S102 to S105, a temperature of the substrate W may be controlled to 100 degrees C. or higher in order to promote desorption of the raw material gas from the first film W1. When the temperature of the substrate W is less than 100 degrees C., the raw material gas is physically adsorbed on the first film W1 without being sufficiently desorbed from the first film W1, so that the third film W3 is formed on the entire surface Wa of the substrate W. The temperature of the substrate W is desirably 300 degrees C. or higher. The temperature of the substrate W is desirably 800 degrees C. or lower.

Figure 3:
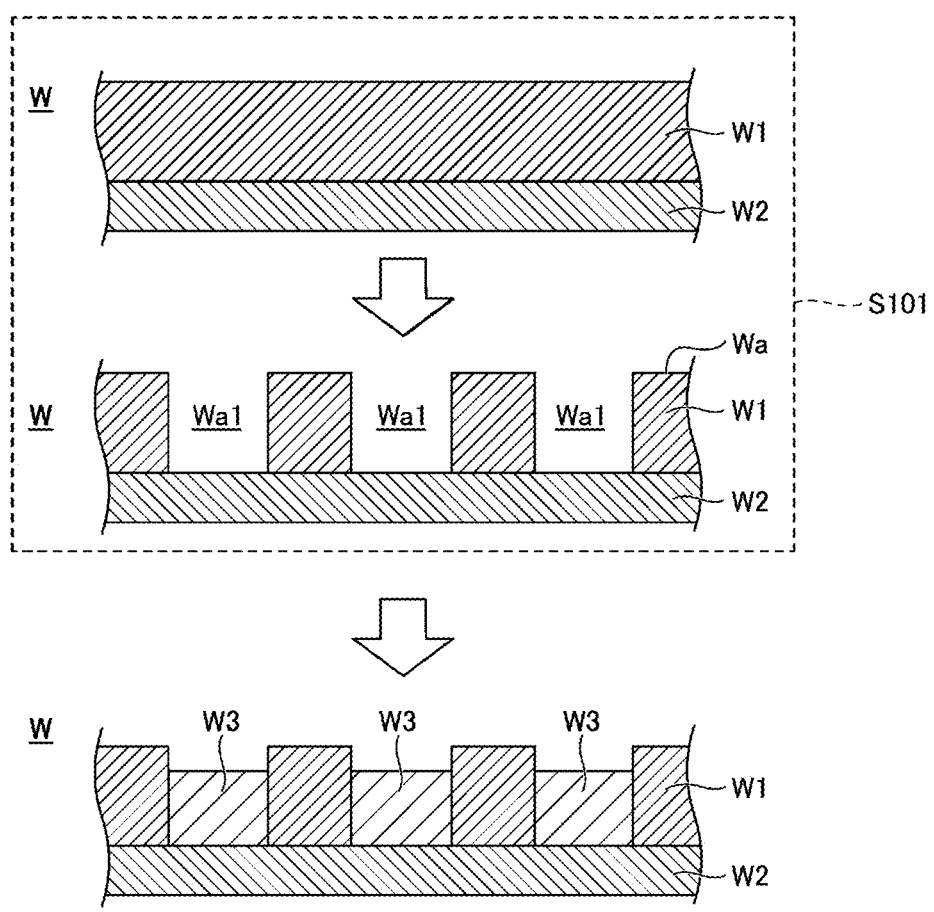
FIG. 3 is a view showing a second example of the substrate prepared in step S101.
Figure 4:
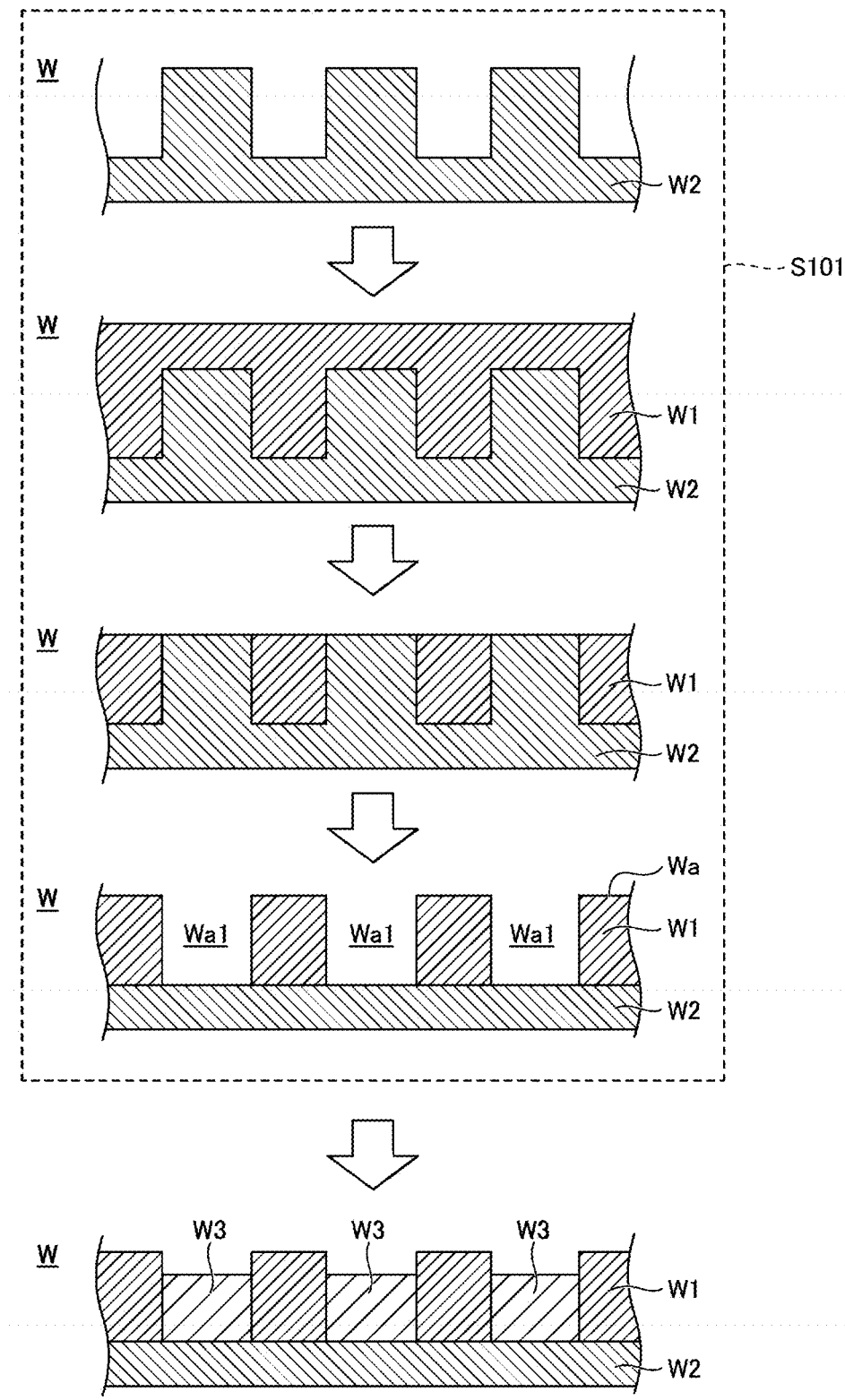
FIG. 4 is a view showing a third example of the substrate prepared in step S101.
Figure 5:
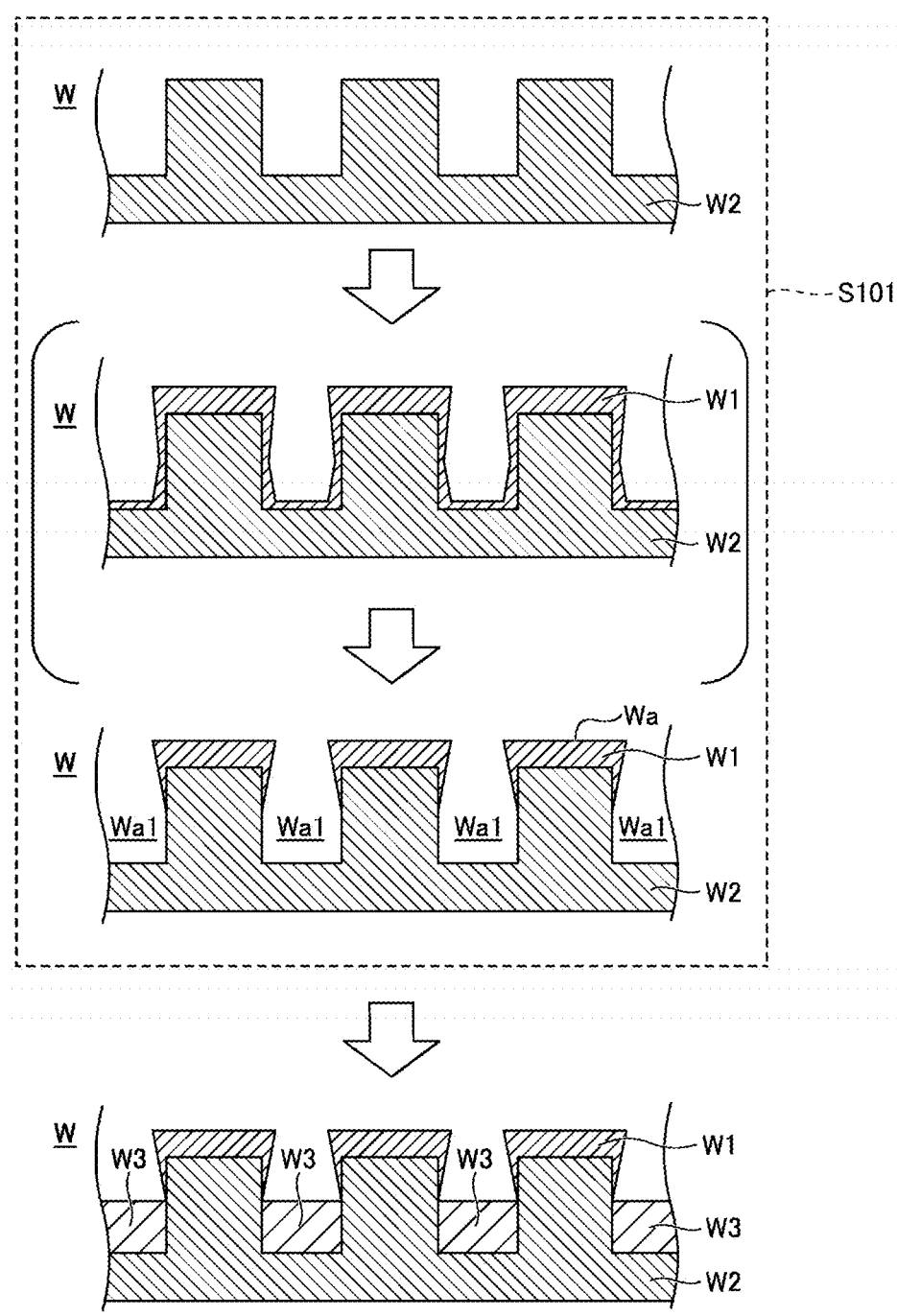
FIG. 5 is a view showing a fourth example of the substrate prepared in step S101.

Next, a case where the substrate W prepared in step S101 has recesses Wa1 on the surface Wa of the substrate W and the second film W2 is exposed only inside the recesses Wa1 will be described with reference to FIGS. 3 to 5. As shown in FIGS. 3 to 5, the second film W2 is exposed at least at bottom surfaces of the recesses Wa1. In this case, by performing steps S102 to S106, interiors of the recesses Wa1 can be filled with the third film W3. Although the third film W3 partially fills the recesses Wa1 in FIGS. 3 to 5, the third film W3 may fill the entire recesses Wa1. In the latter case, in FIG. 5, the first film W1 may be left only on top surface of a protrusions of the second film W2 by etching.

In step S101 of FIG. 3, first, the first film W1 is formed on the entire surface of the second film W2, and then portions of a surface of the first film W1 are etched. As a result, the recesses Wa1 are formed through the portions of the first film W1, and the second film W2 is exposed only at the bottom surfaces of the recesses Wa1. Thereafter, by performing steps S102 to S106, the third film W3 grows only on the bottom surfaces of the recesses Wa1.

In step S101 of FIG. 4, first, portions of the surface of the second film W2 are etched to form recesses on the surface of the second film W2. Next, the first film W1 is formed to fill the recesses. Next, the first film W1 is processed by chemical mechanical polishing (CMP) or etching until the second film W2 is exposed. Finally, the second film W2 is selectively etched with respect to the first film W1. As a result, the recesses Wa1 are formed through portions of the first film W1, and the second film W2 is exposed only at the bottom surfaces of the recesses Wa1. Thereafter, by performing steps S102 to S106, the third film W3 grows only on the bottom surfaces of the recesses Wa1.

In step S101 of FIG. 5, first, portions of the surface of the second film W2 are etched to form recesses on the surface of the second film W2. Next, the first film W1 is selectively formed on the outside of the recesses (that is, on the top surfaces of the protrusions) with respect to the inside of the recess. As a result, the second film W2 is exposed at the bottom and lower side surfaces of the recesses Wa1. Further, when the first film W1 is also deposited on the bottom surfaces of the recesses Wa1 during step S101, the first film W1 deposited on the bottom surfaces is removed by etching or the like. Thereafter, by performing steps S102 to S106, the third film W3 grows on the bottom and lower side surfaces of the recesses Wa1.

Figure 6:
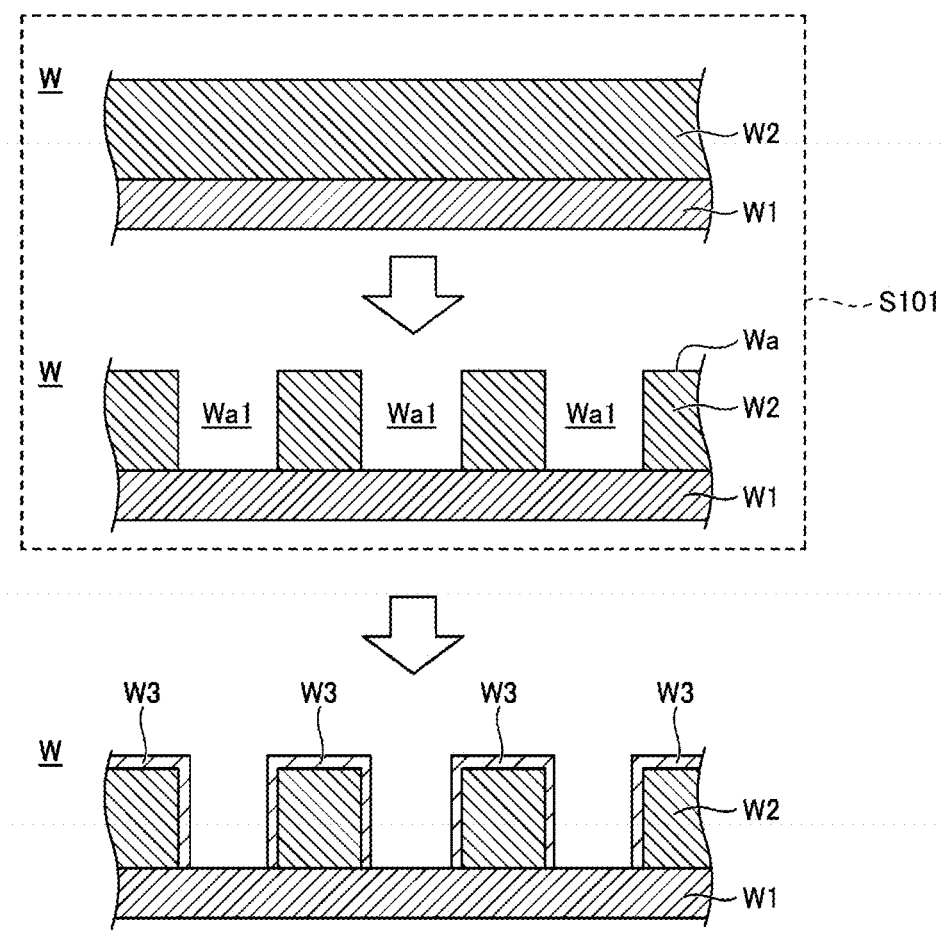
FIG. 6 is a view showing a fifth example of the substrate prepared in step S101.
Figure 7:
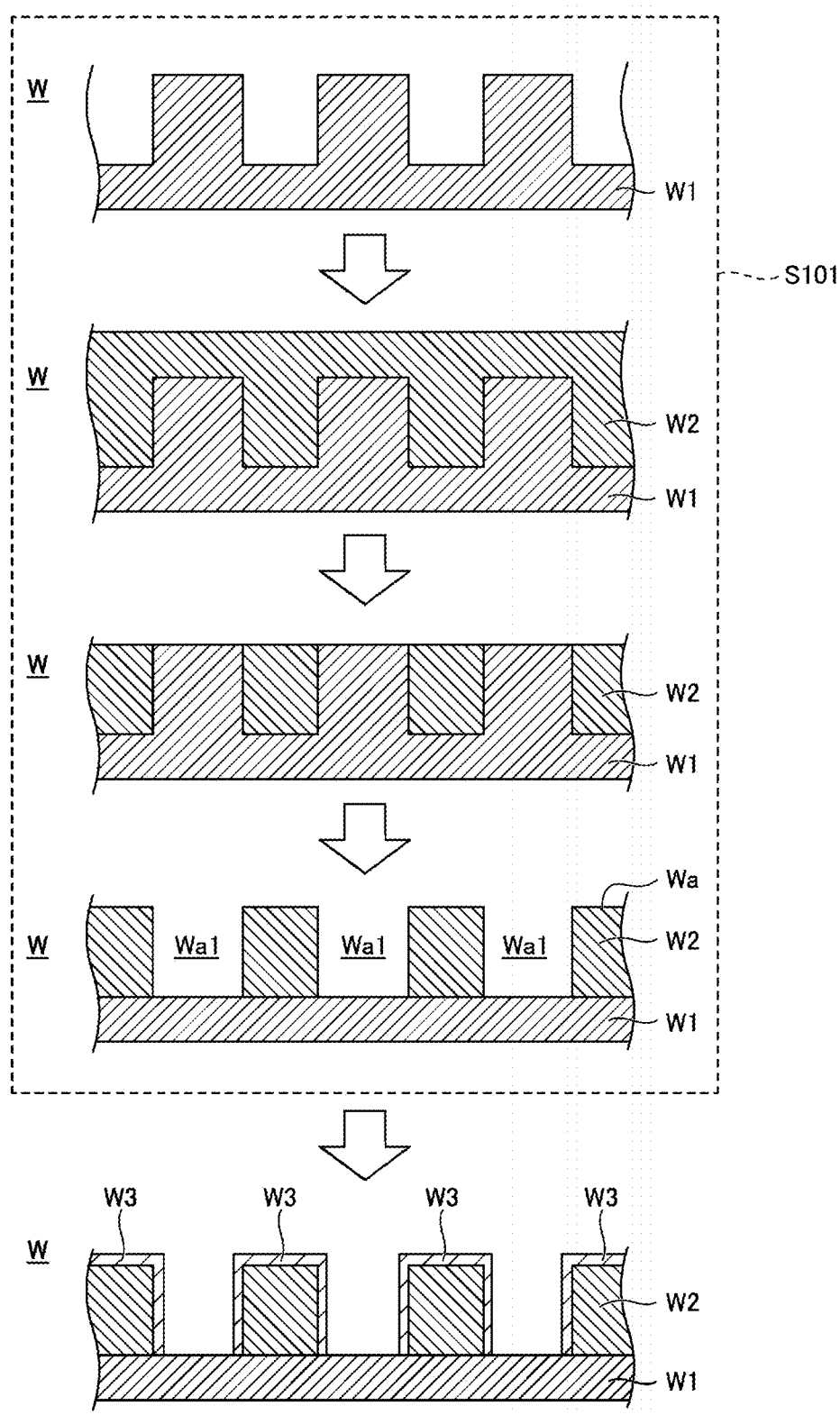
FIG. 7 is a view showing a sixth example of the substrate prepared in step S101.
Figure 8:
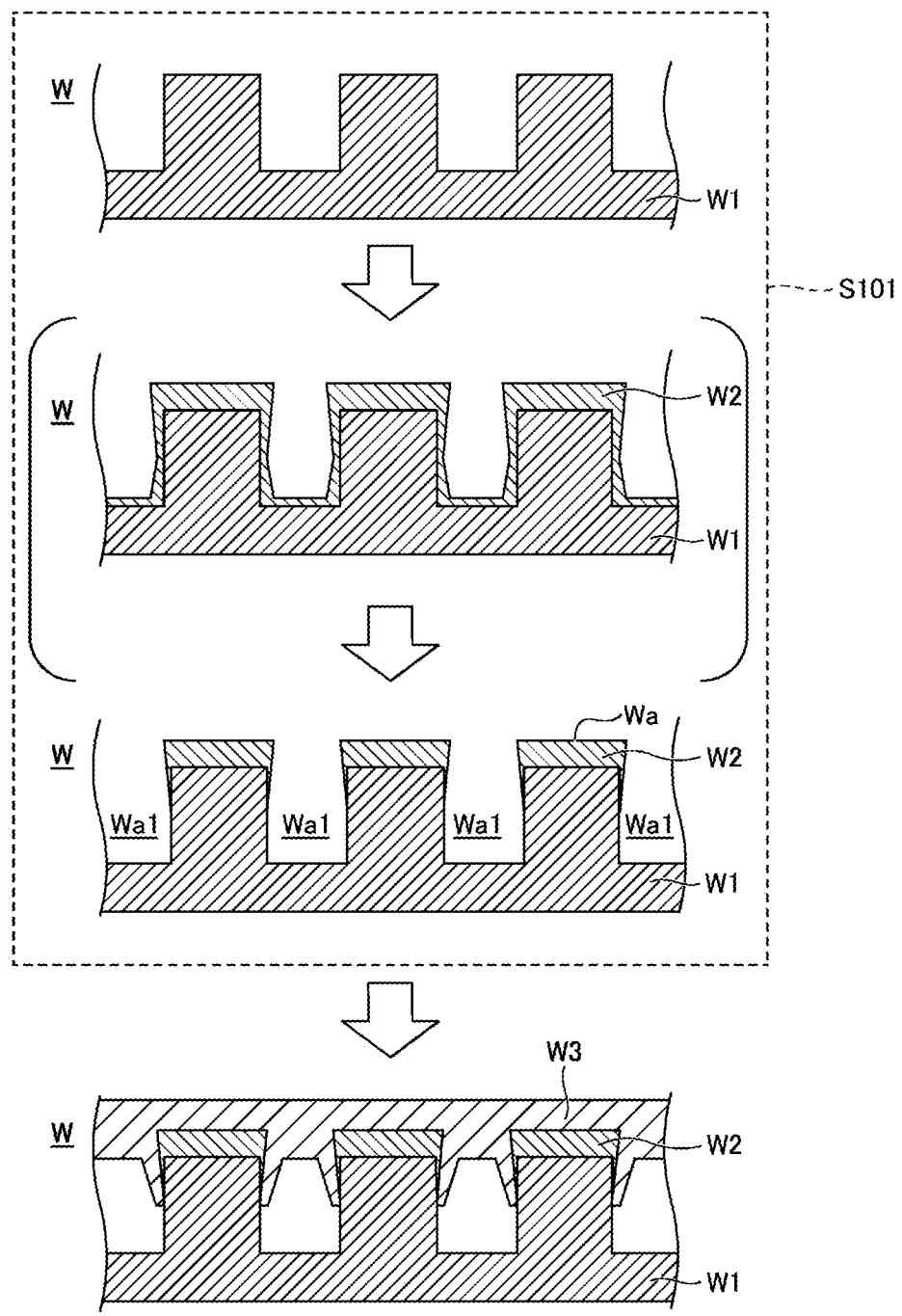
FIG. 8 is a view showing a seventh example of the substrate prepared in step S101.

Next, a case where the substrate W prepared in step S101 has the recesses Wa1 on the surface Wa of the substrate W and the first film W1 is exposed only inside the recesses Wa1 will be described with reference to FIGS. 6 to 8. As shown in FIGS. 6 to 8, the first film W1 is exposed at least at the bottom surfaces of the recesses Wa1. In this case, by performing steps S102 to S106, the third film W3 can be formed on regions other than the bottom surfaces of the recesses Wa1.

In step S101 of FIG. 6, first, the second film W2 is formed on the entire surface of the first film W1, and then portions of the surface of the second film W2 are etched. As a result, the recesses Wa1 are formed through the portions of the second film W2, and the first film W1 is exposed only at the bottom surfaces of the recesses Wa1. Thereafter, by performing steps S102 to S106, the third film W3 grows on the side surfaces of the recesses Wa1 and the outside of the recesses Wa1 (the top surfaces of the protrusions).

In step S101 of FIG. 7, first, portions of the surface of the first film W1 are etched to form recesses on the surface of the first film W1. Next, the second film W2 is formed to fill the recesses. Next, the second film W2 is processed by chemical mechanical polishing (CMP) or etching until the first film W1 is exposed. Finally, the first film W1 is selectively etched with respect to the second film W2. As a result, the recesses Wa1 are formed through portions of the second film W2, and the first film W1 is exposed only at the bottom surfaces of the recesses Wa1. Thereafter, by performing steps S102 to S106, the third film W3 grows on the side surfaces of the recesses Wa1 and the outside of the recesses Wa1 (the top surfaces of the protrusions).

In step S101 of FIG. 8, first, portions of the surface of the first film W1 are etched to form recesses on the surface of the first film W1. Next, the second film W2 is selectively formed on the outside of the recesses (that is, on the top surfaces of the protrusions) with respect to the inside of the recesses. As a result, the first film W1 is exposed at the bottom and lower side surfaces of the recesses Wa1. Further, when the second film W2 is also deposited on the bottom surfaces of the recesses Wa1 during step S101, the second film W2 deposited on the bottom surfaces is removed by etching or the like. Thereafter, by performing steps S102 to S106, the third film W3 grows on the outside of the recesses Wa1 (that is, on the top surfaces of the protrusions) and on the upper side surfaces of the recesses Wa1. As shown in FIG. 8, the third film W3 may confine voids (air gaps) inside the recesses Wa1.

Next, a modification of step S101 will be described with reference to FIGS. 9 and 10. As shown in FIG. 10, step S101 may include selectively forming the first film W1 on a fourth film W4, which is formed of a material different from that of the second film W2, with respect to the second film W2. The first film W1 contains boron as described above.

The fourth film W4 may be any one of an insulating film, a conductive film, and a semiconductor film as long as the first film W1 can be selectively formed on the fourth film W4 with respect to the second film W2. For example, an incubation time of the first film W1 with respect to the second film W2 may be longer than an incubation time of the first film W1 with respect to the fourth film W4. The first film W1 can be selectively formed using the difference in incubation time.

The incubation time is a time difference from a start of a film forming process (for example, a start of supplying the raw material gas or the reaction gas) to an actual start of film formation.

Figure 9:
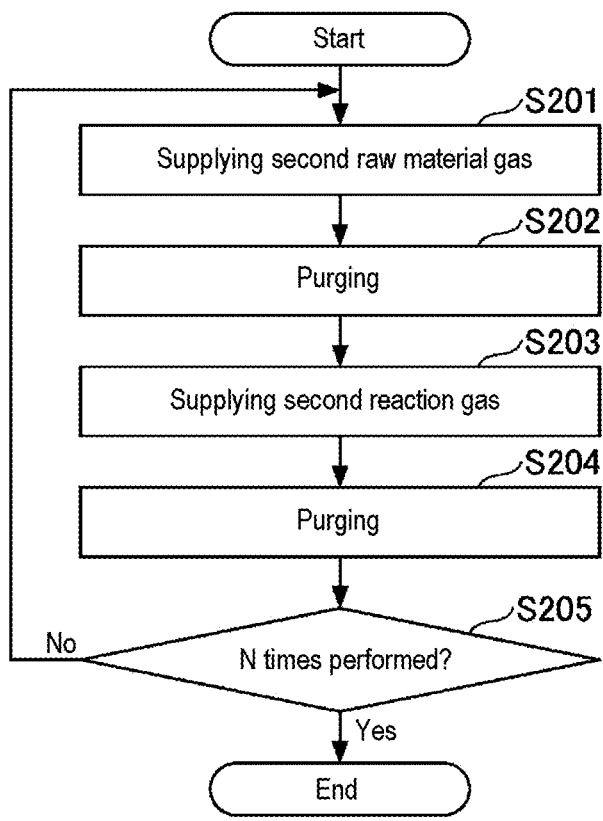
FIG. 9 is a flowchart showing an example of steps S201 to S205 performed in step S101.
Figure 10:
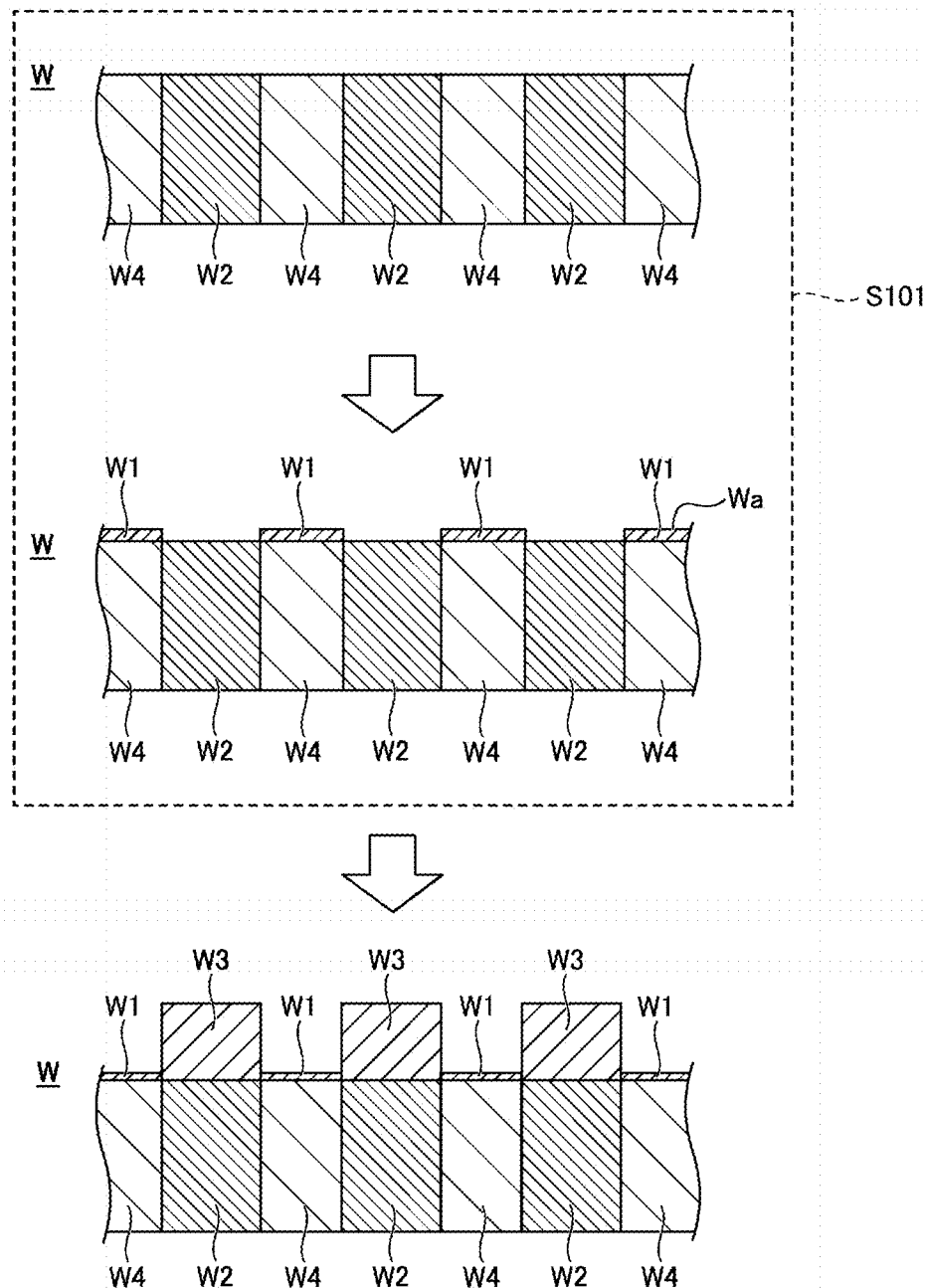
FIG. 10 is a view showing an eighth example of the substrate prepared in step S101.

Step S101 includes steps S201 to S205 shown in FIG. 9, for example. Note that step S101 may include at least steps S201 and S203. The order of steps S201 and S203 may be reversed, and step S203 may be performed before step S201. Steps S201 and S203 may be performed simultaneously, and a CVD method may be used.

Step S201 of FIG. 9 includes supplying a second raw material gas to the surface of the substrate W. The second raw material gas contains boron. The second raw material gas contains, for example, trisdimethylaminoborane (TDMAB: $C_6H_{18}BN_3$). The second raw material gas may be supplied together with a dilution gas. The dilution gas is, for example, Ar gas or $N_2$ gas.

The second raw material gas is not limited to a gas containing TDMAB, and may be a gas containing boron. For example, the second raw material gas may include diborane ($B_2H_6$), boron trichloride ($BCl_3$), boron trifluoride ($BF_3$), trisethylmethylaminoborane ($C_9H_{24}BN_3$), trimethylborane ($C_3H_9B$), triethylborane ($C_6H_{15}B$), cyclotriborazane ($B_3N_3H_6$), or the like.

Step S202 of FIG. 9 includes supplying a purge gas to the surface of the substrate W. The purge gas purges the excessive second raw material gas that has not been adsorbed to the surface Wa of the substrate W in step S201. As the purge gas, for example, a rare gas such as Ar gas or $N_2$ gas is used.

Step S203 of FIG. 9 includes supplying a second reaction gas to the surface of the substrate W. The second reaction gas contains, for example, nitrogen and forms the first film W1 (for example, a BN film) by nitriding the adsorbed second raw material gas. The second reaction gas includes, for example, a mixture of $N_2$ gas and $H_2$ gas, or $NH_3$ gas. The second reaction gas may be supplied together with a dilution gas. The dilution gas is, for example, Ar gas or $N_2$ gas.

In addition, the second reaction gas may contain at least one of a nitrogen-containing gas, an oxygen-containing gas, and a reducing gas. The nitrogen-containing gas forms a boron nitride film by nitriding the second raw material gas. The nitrogen-containing gas includes, for example, $NH_3$, $N_2$, $N_2H_4$, or $N_2H_2$. The oxygen-containing gas forms a boron oxide film by oxidizing the second raw material gas. The oxygen-containing gas includes, for example, $O_2$, $O_3$, $H_2O$, NO, or $N_2O$. The reducing gas forms a boron film by reducing the second raw material gas. The reducing gas includes, for example, $H_2$ or $SiH_4$.

Step S203 may include plasmarizing the second reaction gas, and may include supplying the plasmarized second reaction gas to the surface Wa of the substrate W. The formation of the first film W1 can be promoted by plasmarizing the second reaction gas.

In addition, the second reaction gas may be supplied not only in step S203 but also in all of steps S201 to S204. However, the second reaction gas is plasmarized in step S203 only. The reason is because a reaction of the second reaction gas with the second raw material gas adsorbed on the surface of the substrate W is promoted by being plasmarized.

Step S204 of FIG. 9 includes supplying a purge gas to the substrate W surface. The purge gas purges the excessive second reaction gas that has not reacted with the surface Wa of the substrate W in step S203. As the purge gas, for example, a rare gas such as Ar gas or $N_2$ gas is used.

In step S205 of FIG. 9, it is determined whether or not steps S201 to S204 have been performed M times (M is an integer of one or more). M may be an integer of two or more, and steps S201 to S204 may be repeatedly performed. A film thickness of the first film W1 may be increased.

When an execution number of steps S201 to S204 is less than M times ("NO" in step S205), the film thickness of the first film W1 is less than a target value, and thus steps S201 to S204 are performed again. The target value of the film thickness of the first film W1 is desirably 300 angstroms or less, specifically 100 angstroms or less, and more specifically 50 angstroms or less. The film thickness of the first film W1 may be about 5 angstroms.

On the other hand, when the execution number of steps S201 to S204 reaches M times ("YES" in step S205), the film thickness of the first film W1 has reached the target value. Thus, the current process ends.

The method of forming the first film W1 shown in FIG. 9 is an ALD method, but may be a CVD method. In the ALD method, the supply of the second raw material gas and the supply of the second reaction gas are alternately performed. On the other hand, in the CVD method, the supply of the second raw material gas and the supply of the second reaction gas are performed simultaneously.

The first film W1 may be a molecular film in which molecules are chemically adsorbed, such as a self-assembled monolayer (SAM). The molecules are supplied to a substrate surface in a gaseous or liquid form. The molecules have a first functional group that is selectively chemisorbed to a desired region of the substrate surface. The first functional group is not particularly limited, but is, for example, a thiol group (SH group), a carboxy group (COOH group), or a hydroxyl group (OH group). The molecules have a second functional group containing B in addition to the first functional group. The second functional group is a functional group such as $BH_3$ or $B(CH_3)_3$ in which at least some of carbon atoms in a hydrocarbon group are substituted with boron (B). The first film W1 may be a thermally decomposed molecular film.

Figure 20:
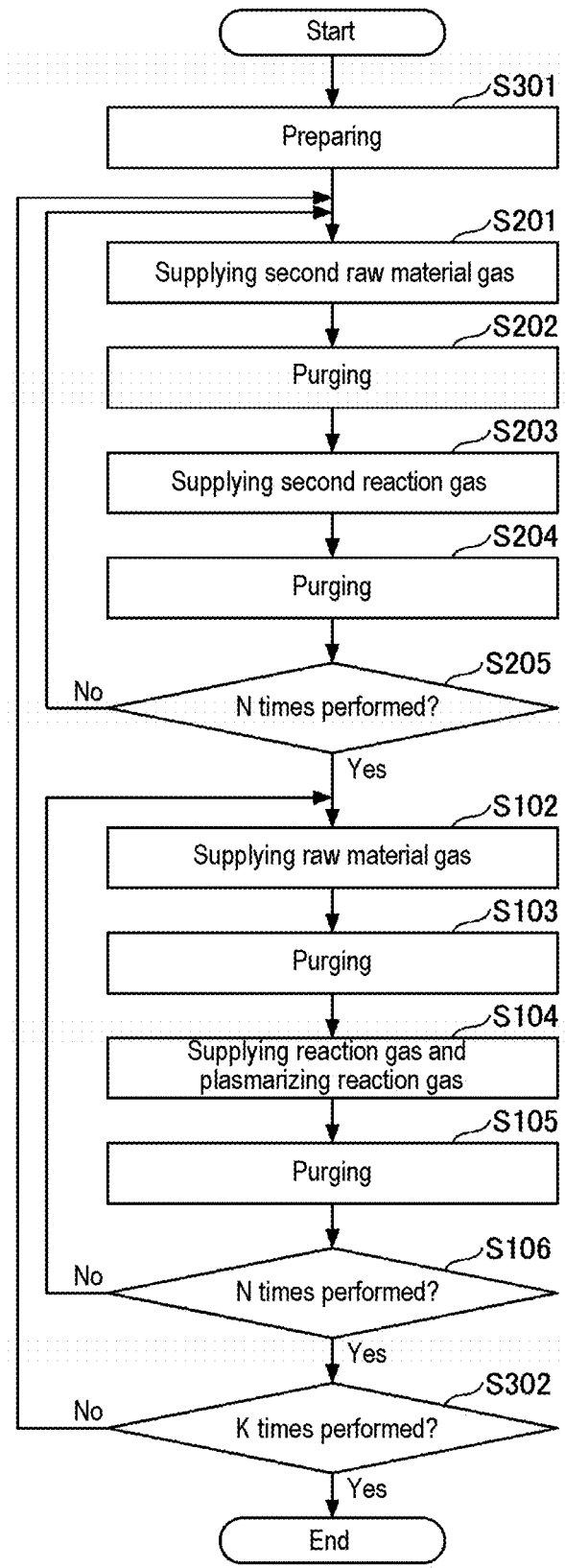
FIG. 20 is a flowchart showing a film forming method according to a modification.

Next, a film forming method according to a modification will be described with reference to FIG. 20. As shown in FIG. 20, the film forming method of this modification includes step 301, steps S201 to S205, steps S102 to S106, and step S302.

Steps S201 to S205 in FIG. 20 are the same as steps S201 to S205 in FIG. 9, and thus explanation thereof will be omitted. Note that the film forming method does not have to include all of steps S201 to S205. It suffices when the first film W1 can be selectively formed in a desired region.

Further, steps S102 to S106 in FIG. 20 are the same as steps S102 to S106 in FIG. 1, and thus explanation thereof will be omitted. Note that the film forming method does not have to include all of steps S102 to S106. It suffices when the third film W3 can be selectively formed in a desired region.

Figure 22:
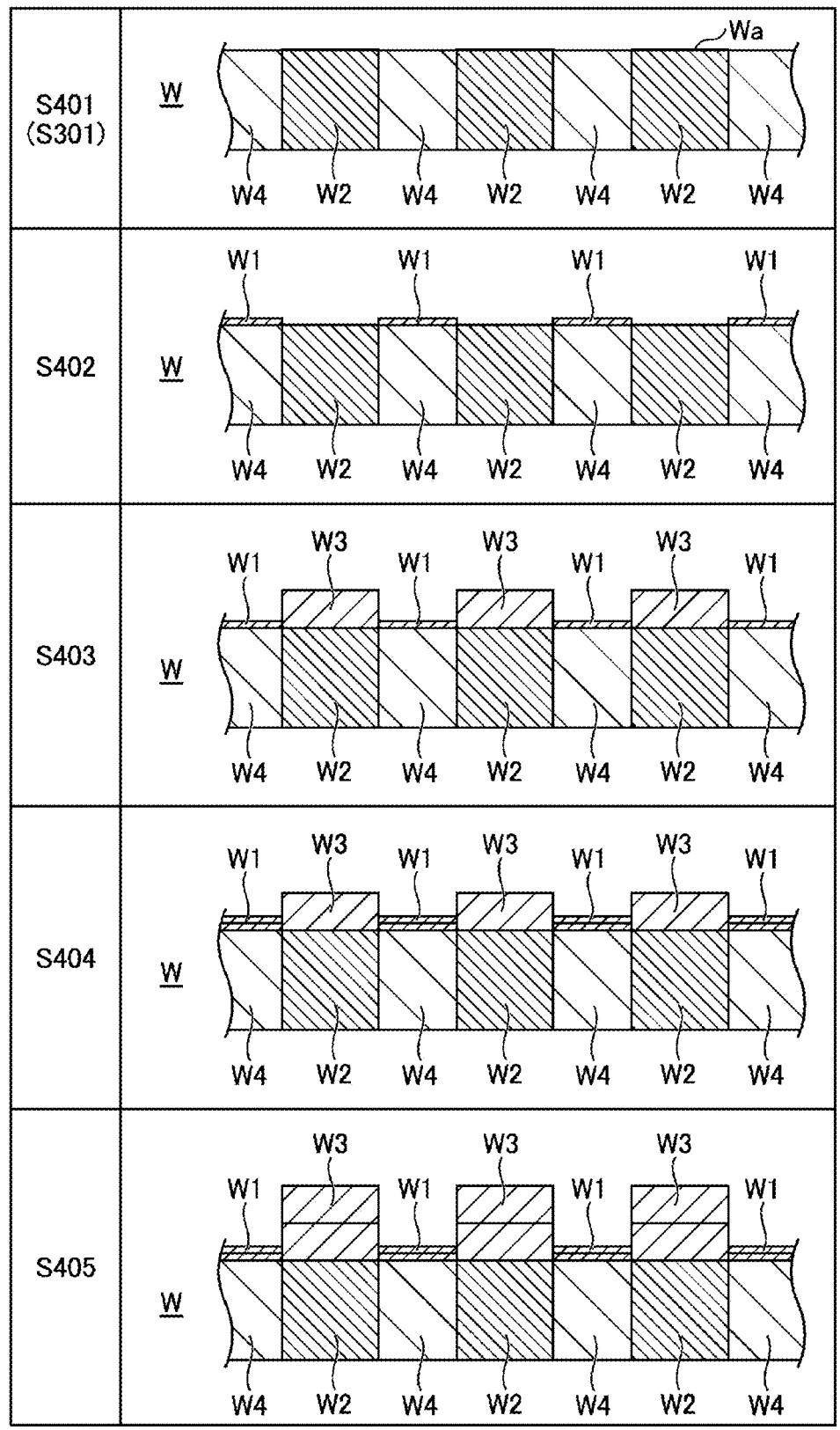
FIG. 22 is a view showing an example of a process of FIG. 21.

Step S301 includes preparing the substrate W having a surface Wa on which the second film W2 and the fourth film W4 are formed (see FIG. 22). Thereafter, in steps S201 to S205, the first film W1 is selectively formed on the fourth film W4 with respect to the second film W2. Thereafter, in steps S102 to S106, the third film W3 is selectively formed on the second film W2 with respect to the first film W1.

Step S302 includes determining whether or not a series of processes has been performed K times (K is an integer of one or more). The series of processes includes performing steps S201 to S204 M times (M is an integer of one or more) and performing steps S102 to S105 N times (N is an integer of one or more).

When an execution number of the series of processes is less than K times ("NO" in step S302), a film thickness of the third film W3 is insufficient, and thus a controller 100 performs the series of processes again. On the other hand, when the execution number of the series of processes reaches K times ("YES" in step S302), the controller 100 ends the current process. K is desirably an integer of two or more. When K is an integer of two or more, the film thickness of the third film W3 can be increased while replenishing the first film W1.

Figure 21:
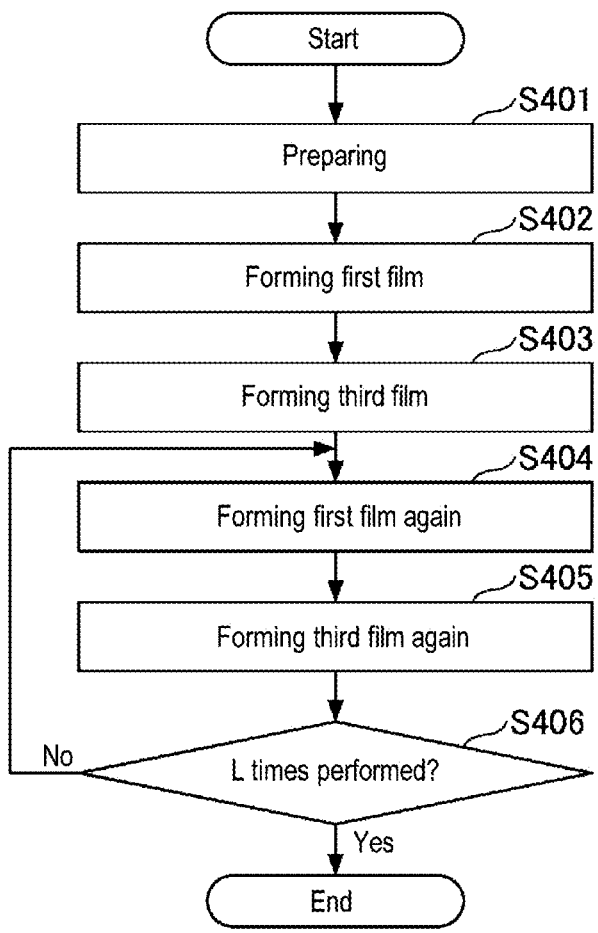
FIG. 21 is a flowchart showing a procedure when K in FIG. 20 is an integer of two or more.

Next, a film forming method when K is an integer of two or more will be described with reference to FIGS. 21 to 23. As shown in FIG. 21, the film forming method may include steps S401 to S405. In FIG. 21, L is equal to (K−1).

Similar to step S301, step S401 includes preparing the substrate W having a surface Wa on which the second film W2 and the fourth film W4 are formed (see FIG. 22). The fourth film W4 may be any one as long as the first film W1 can be selectively formed on the fourth film W4 with respect to the second film W2. For example, the incubation time of the first film W1 with respect to the second film W2 may be longer than the incubation time of the first film W1 with respect to the fourth film W4.

Step S402 includes selectively forming the first film W1 on the fourth film W4 with respect to the second film W2 (see FIG. 22). Step S402 includes performing steps S201 to S204 M times. M is an integer of one or more. M may be an integer of two or more.

Step S403 includes selectively forming the third film W3 on the second film W2 with respect to the first film W1 (see FIG. 22). Step S403 includes performing steps S102 to S105 N times. N is an integer of one or more. N may be an integer of two or more.

Step S404 includes selectively forming the first film W1 again on the first film W1 with respect to the third film W3 (see FIG. 22). Similar to step S402, step S404 includes performing steps S201 to S204 M times.

Figure 23:
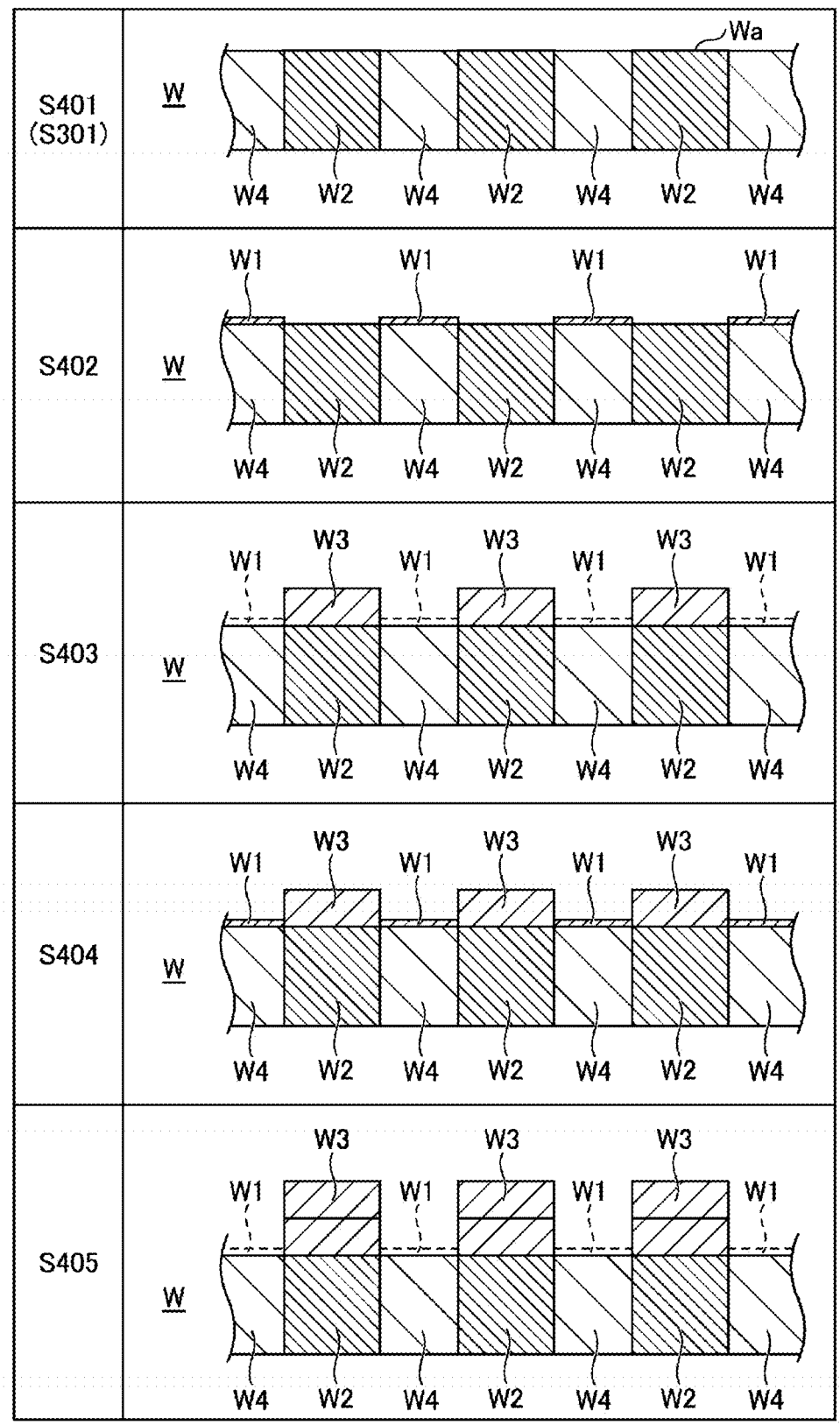
FIG. 23 is a view showing another example of the process of FIG. 21.

In the process of forming the third film W3 in step S403, the first film W1 may become thin, or the first film W1 may disappear (see FIG. 23). When the first film W1 disappears, step S404 includes selectively forming the first film W1 again on the fourth film W4 instead of the first film W1 (see FIG. 23).

Step S405 includes selectively forming the third film W3 again on the third film W3 with respect to the first film W1. Similar to step S403, step S405 includes performing steps S102 to S105 N times.

Step S406 includes determining whether or not steps S404 and S405 have been performed L (L=(K−1)) times. When an execution number of steps S404 and S405 is less than L times ("NO" in step S406), the controller 100 performs steps S404 and S405 again. On the other hand, when the execution number of steps S404 and S405 reaches L times ("YES" in step S406), the controller 100 ends the current process.

Figure 24:
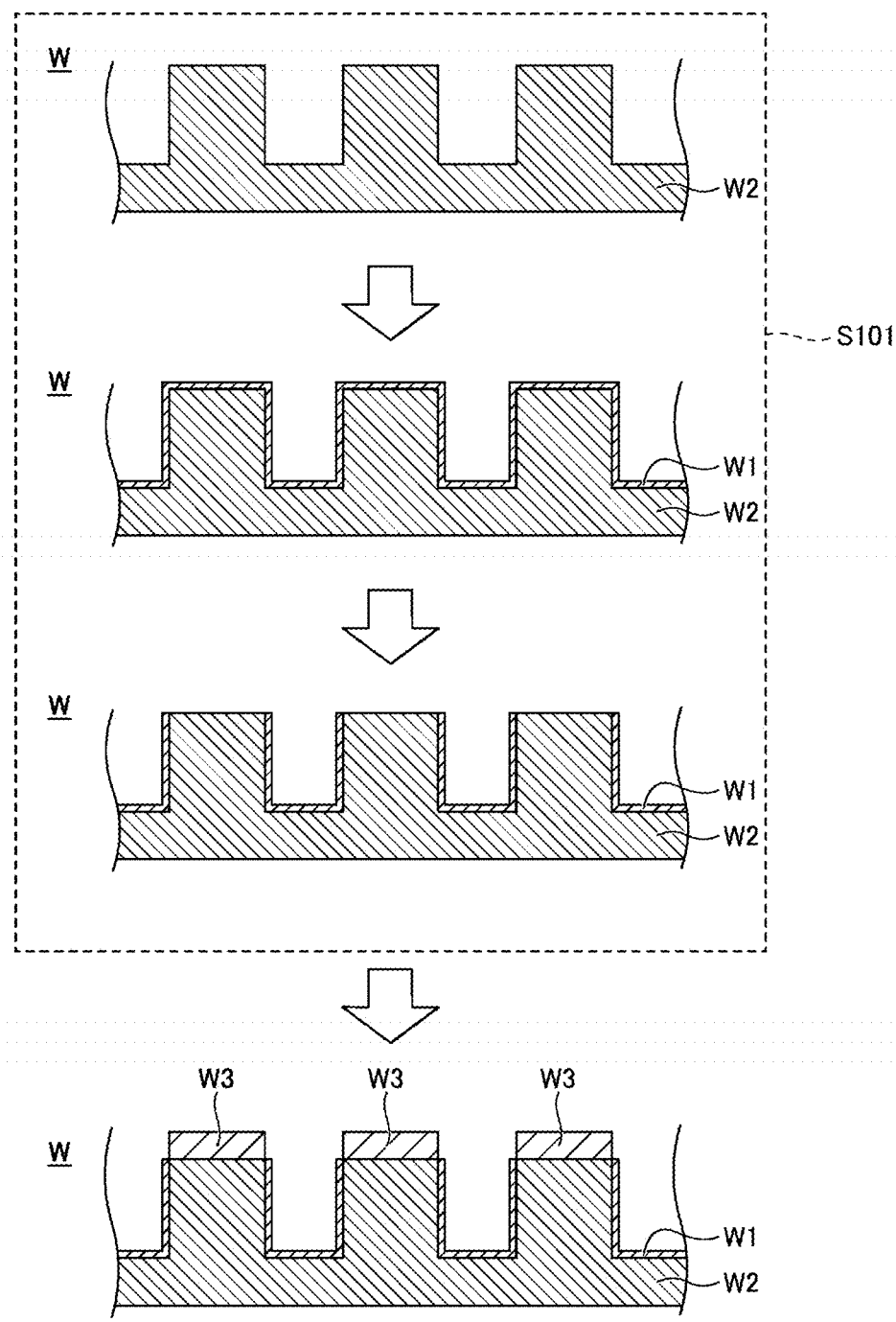
FIG. 24 is a view showing a ninth example of the substrate prepared in step S101.

Next, another modification of step S101 will be described with reference to FIG. 24. In step S101 of FIG. 24, first, the second film W2 having an uneven pattern is prepared. Subsequently, the first film W1 is formed along the uneven pattern of the second film W2 over the entire second film W2 by an ALD method or a CVD method. Subsequently, top surfaces of protrusions of the second film W2 are exposed by CMP or etching. At this time, the first film W1 is left on the side and bottom surfaces of recesses of the second film W2.

Thereafter, by performing steps S102 to S106, the third film W3 may be formed on the top surfaces of the protrusions.

Figure 25:
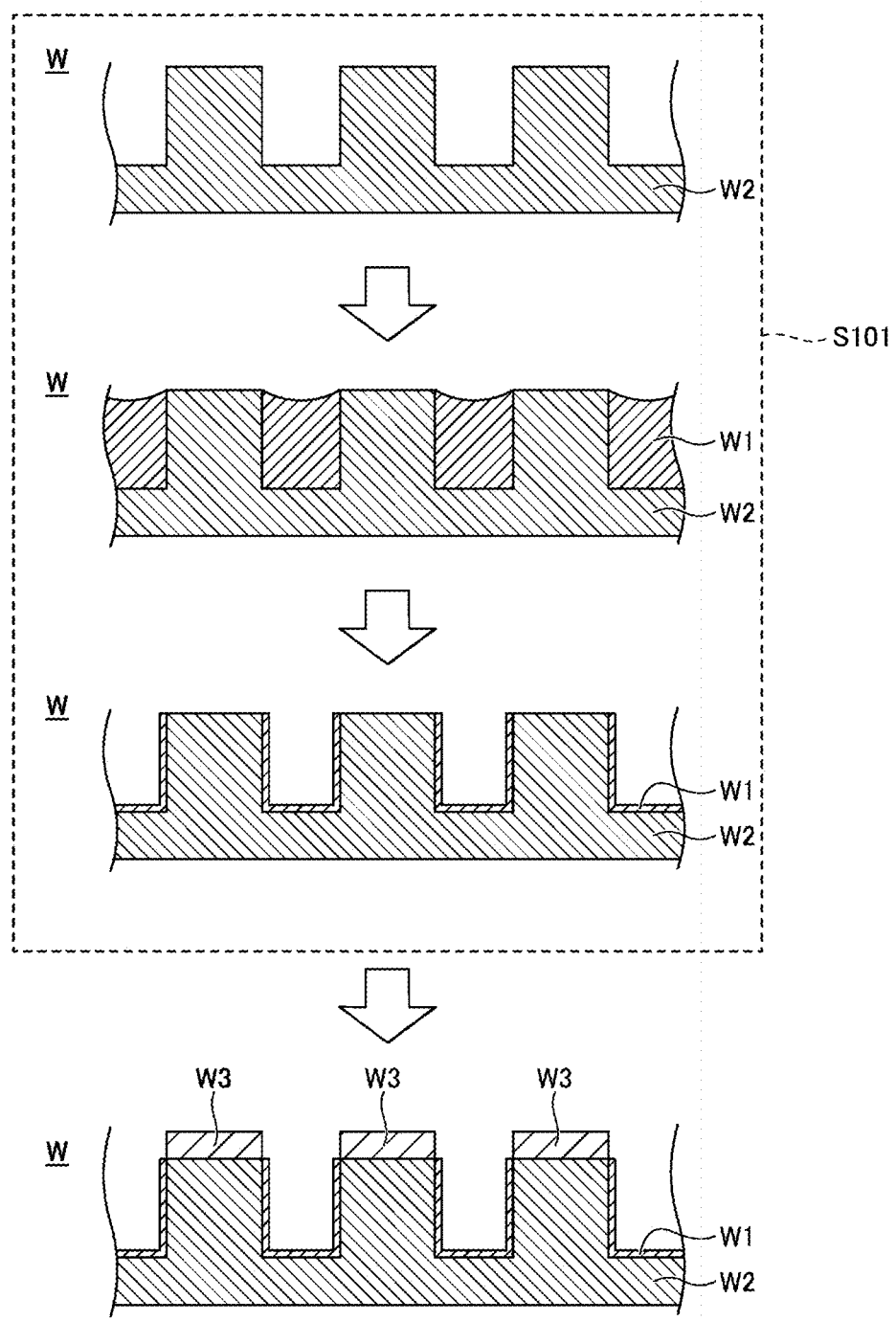
FIG. 25 is a view showing a tenth example of the substrate prepared in step S101.

Next, still another modification of step S101 will be described with reference to FIG. 25. In step S101 of FIG. 25, first, the second film W2 having an uneven pattern is prepared. Subsequently, the first film W1 is formed to fill recesses of the second film W2. The first film W1 is a liquid. The liquid is obtained by, for example, polymerizing B-containing molecules having organic ligands such as TDMAB with $N_2$ plasma or the like. Subsequently, the liquid buried in the recesses of the second film W2 is decomposed by $O_2$ plasma or the like, leaving the first film W1 on the side and bottom surfaces of the recesses of the second film W2. Top surfaces of protrusions of the second film W2 remain exposed. Although not shown, the liquid buried in the recesses of the second film W2 may be modified with $H_2$ plasma or the like to form the first film W1 buried in the recesses of the second film W2. Thereafter, by performing steps S102 to S106, the third film W3 may be formed on the top surfaces of the protrusions.

Figure 11:
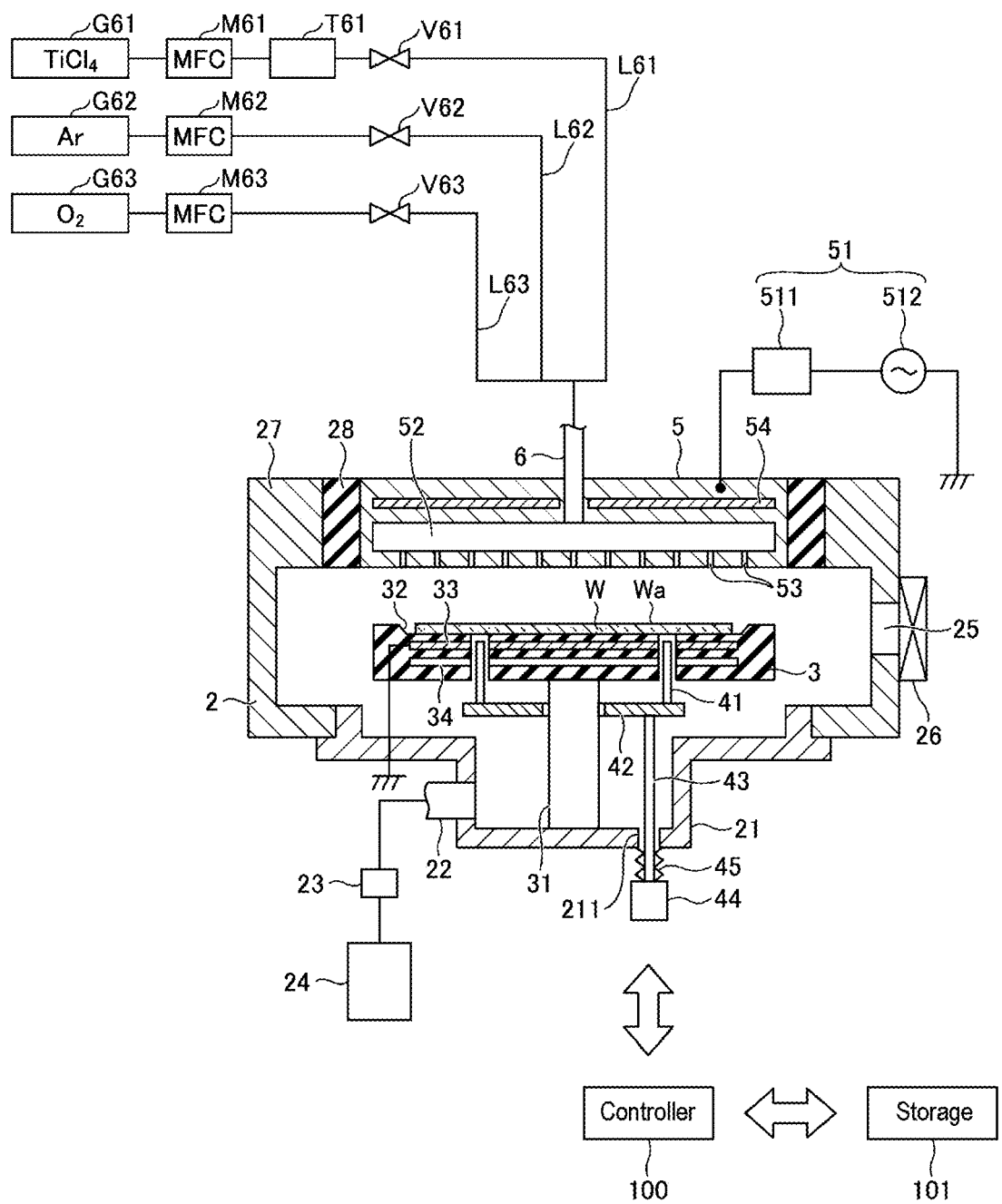
FIG. 11 is a cross-sectional view showing a film forming apparatus according to one embodiment.

Next, a film forming apparatus 1 will be described with reference to FIG. 11. The film forming apparatus 1 includes a substantially cylindrical airtight process container 2. An exhaust chamber 21 is provided in a central portion of a bottom wall of the process container 2. The exhaust chamber 21 has, for example, a substantially cylindrical shape protruding downward. An exhaust pipe 22 is connected to the exhaust chamber 21, for example, on a side surface of the exhaust chamber 21.

An exhauster 24 is connected to the exhaust pipe 22 via a pressure regulator 23. The pressure regulator 23 includes, for example, a pressure regulating valve such as a butterfly valve. The exhaust pipe 22 is configured so as to depressurize an interior of the process container 2 by the exhauster 24. A transfer opening 25 is provided on the side surface of the process container 2. The transfer opening 25 is opened and closed by a gate valve 26. The substrate W is loaded and unloaded between the process container 2 and a transfer chamber (not shown) via the transfer opening 25.

A stage 3 is provided inside the process container 2. The stage 3 is a holder that horizontally holds the substrate W with the surface Wa of the substrate W facing upward. The stage 3 has a substantially circular shape in a plan view and is supported by a support 31. A surface of the stage 3 is formed with a substantially circular recess 32 for placing the substrate W having a diameter of 300 mm, for example. The recess 32 has an inner diameter slightly larger than the diameter of the substrate W. A depth of the recess 32 is substantially the same as the thickness of the substrate W, for example. The stage 3 is made of a ceramic material such as aluminum nitride (AlN). The stage 3 may also be made of a metallic material such as nickel (Ni). Instead of the recess 32, a guide ring for guiding the substrate W may also be provided on a periphery of the surface of the stage 3.

For example, a grounded lower electrode 33 is buried in the stage 3. A heating mechanism 34 is buried below the lower electrode 33. The heating mechanism 34 heats the substrate W placed on the stage 3 to a set temperature by receiving power from a power supply (not shown) based on a control signal from the controller 100. When the entirety of the stage 3 is made of metal, the entire stage 3 functions as a lower electrode, and thus the lower electrode 33 does not have to be buried in the stage 3. The stage 3 is provided with a plurality of lift pins 41 (for example, three lift pins 41) for holding and lifting the substrate W placed on the stage 3. A material of the lift pins 41 may be, for example, ceramics such as alumina ($Al_2O_3$), quartz, or the like. A lower end of each lift pin 41 is attached to a support plate 42. The support plate 42 is connected to an elevating mechanism 44 provided outside the process container 2 via an elevating shaft 43.

The elevating mechanism 44 is installed, for example, below the exhaust chamber 21. A bellows 45 is provided between the elevating mechanism 44 and an opening 211 for the elevating shaft 43 formed on a lower surface of the exhaust chamber 21. A shape of the support plate 42 may be a shape that allows it to move up and down without interfering with the support 31 of the stage 3. The lifts pins 41 are configured to be vertically movable between a location above the surface of the stage 3 and a location below the surface of the stage 3 by means of the elevating mechanism 44.

A gas supply 5 is provided on a ceiling wall 27 of the process container 2 via an insulator 28. The gas supply 5 forms an upper electrode and faces the lower electrode 33. A radio frequency power supply 512 is connected to the gas supply 5 via a matching device 511. By supplying radio frequency power of 100 kHz to 2.45 GHz, desirably 450 kHz to 100 MHz, from the radio frequency power supply 512 to the upper electrode (the gas supply 5), a radio frequency electric field is generated between the upper electrode (the gas supply 5) and the lower electrode 33 to generate capacitively-coupled plasma. A plasma generator 51 includes the matching device 511 and the radio frequency power supply 512. The plasma generator 51 is not limited to generate the capacitively-coupled plasma, and may generate other plasma such as inductively-coupled plasma. In addition, a plasmarized gas may be supplied from a remote plasma source.

The gas supply 5 has a hollow gas supply chamber 52. A plurality of holes 53 for distributing and supplying a process gas into the process container 2 is disposed, for example, evenly on a lower surface of the gas supply chamber 52. A heating mechanism 54 is buried above, for example, the gas supply chamber 52 in the gas supply 5. The heating mechanism 54 is heated to a set temperature by receiving power from a power supply (not shown) based on a control signal from the controller 100.

A gas supply path 6 is provided in the gas supply chamber 52. The gas supply path 6 is in communication with the gas supply chamber 52. Gas sources G61, G62, and G63 are connected to an upstream of the gas supply path 6 via gas lines L61, L62, and L63, respectively. Note that the number of gas sources and the types of gases are not limited to those shown in FIG. 11.

The gas source G61 is a $TiCl_4$ gas source and is connected to the gas supply path 6 via the gas line L61. The gas line L61 is provided with a mass flow controller M61, a storage tank T61, and a valve V61 sequentially from a side of the gas source G61. The mass flow controller M61 controls a flow rate of $TiCl_4$ gas flowing through the gas line L61. With the valve V61 closed, the storage tank T61 can store the $TiCl_4$ gas supplied from the gas source G61 via the gas line L61, and increase a pressure of the $TiCl_4$ gas in the storage tank T61. The valve V61 performs a supply and stop of the $TiCl_4$ gas to the gas supply path 6 by an opening/closing operation.

The gas source G62 is an Ar gas source and is connected to the gas supply path 6 via the gas line L62. The gas line L62 is provided with a mass flow controller M62 and a valve V62 sequentially from a side of the gas source G62. The mass flow controller M62 controls a flow rate of Ar gas flowing through the gas line L62. The valve V62 performs a supply and stop of the Ar gas to the gas supply path 6 by an opening/closing operation.

The gas source G63 is an $O_2$ gas source and is connected to the gas supply path 6 via the gas line L63. The gas line L63 is provided with a mass flow controller M63 and a valve V63 sequentially from a side of the gas source G63. The mass flow controller M63 controls a flow rate of $O_2$ gas flowing through the gas line L63. The valve V63 performs a supply and stop of the $O_2$ gas to the gas supply path 6 by an opening/closing operation.

The film forming apparatus 1 includes the controller 100 and a storage 101. The controller 100 includes a CPU, a RAM, a ROM, and the like, (none of which are shown), and comprehensively controls the film forming apparatus 1 by causing the CPU to execute a computer program stored in the ROM or the storage 101, for example. Specifically, the controller 100 causes the CPU to execute a control program stored in the storage 101 to control operations of respective components of the film forming apparatus 1, thereby performing a film forming process and the like on the substrate W.

Next, an operation of the film forming apparatus 1 will be described with reference back to FIG. 11. First, the controller 100 opens the gate valve 26, transfers the substrate W into the process container 2 by a transfer mechanism, and places the substrate W on the stage 3. The substrate W is placed horizontally with the surface Wa facing upward. The controller 100 retracts the transfer mechanism from the process container 2 and then closes the gate valve 26. Subsequently, the controller 100 heats the substrate W to a predetermined temperature by the heating mechanism 34 of the stage 3 and adjusts the interior of the process container 2 to a predetermined pressure by the pressure regulator 23. For example, step S101 in FIG. 1 includes loading the substrate W into the process container 2, and the like.

Subsequently, the controller 100 performs step S102 of FIG. 1. In step S102, the valves V61, V62, and V63 are opened to supply the $TiCl_4$ gas, the Ar gas, and the $O_2$ gas, respectively, into the process container 2 at the same time.

Specific process conditions of step S102 are, for example, as follows.

Flow rate of the $TiCl_4$ gas: 1 sccm to 500 sccm
Flow rate of the Ar gas: 100 sccm to 100,000 sccm
Flow rate of the $O_2$ gas: 100 sccm to 100,000 sccm
Processing time: 0.1 second to 30 seconds
Processing temperature: 100 degrees C. to 450 degrees C.
Processing pressure: 3 Pa to 10,000 Pa Subsequently, the controller 100 performs step S103 of FIG. 1. In step S103, the valve V61 is closed. At this time, since the valves V62 and V63 are opened, the Ar gas and the $O_2$ gas are supplied into the process container 2, and the $TiCl_4$ gas remaining in the process container 2 is discharged to the exhaust pipe 22.

Specific process conditions of step S103 are, for example, as follows.

Flow rate of the Ar gas: 100 sccm to 100,000 sccm
Flow rate of the $O_2$ gas: 100 sccm to 100,000 sccm
Processing time: 0.1 second to 30 seconds
Processing temperature: 100 degrees C. to 450 degrees C.
Processing pressure: 3 Pa to 10,000 Pa Subsequently, the controller 100 performs step S104 of FIG. 1. In step S104, plasma is generated by the plasma generator 51 to plasmarize the $O_2$ gas. As a result, the adsorbed $TiCl_4$ gas is oxidized to form, for example, a TiO film. The TiO film is selectively formed on the second film W2 with respect to the first film W1. Specific process conditions of step S104 are the same as the process conditions of step S103, except for the generation of plasma, and thus explanation thereof will be omitted.

Subsequently, the controller 100 performs step S105 of FIG. 1. In step S105, the generation of plasma is stopped. At this time, since the valves V62 and V63 are opened, the Ar gas and the $O_2$ gas are supplied into the process container 2, and the plasmarized gas remaining in the process container 2 is discharged to the exhaust pipe 22. Specific process conditions of step S105 are the same as the process conditions of step S103, and thus explanation thereof will be omitted.

Subsequently, in step S106 of FIG. 1, the controller 100 determines whether or not steps S102 to S105 have been performed N times (N is a natural number of one or more). When the execution number of steps S102 to S105 is less than N times ("NO" in step S106), the controller 100 performs steps S102 to S105 again. On the other hand, when the execution number of steps S102 to S105 reaches N times ("YES" in step S106), the controller 100 ends the current process. Thereafter, the controller 100 opens the gate valve 26 and transfers the substrate W out of the process container 2 by the transfer mechanism. The controller 100 retracts the transfer mechanism from the process container 2 and then closes the gate valve 26.

In addition, the controller 100 may perform steps S201 to S205 shown in FIG. 9. In addition, the controller 100 may perform the series of processes shown in FIG. 20. The series of processes includes performing steps S201 to S204 M times (M is an integer of one or more) and performing steps S102 to S105 N times (N is an integer of one or more). The controller 100 performs the series of processes K times (K is an integer of one or more).

Although steps S102 to S105 are performed N times in FIG. 1, steps S102A and S103A may be performed after step S103 and before step S104, as shown in Table 12, which will be described later. Step S102A is performed in the same manner as step S102 except that a raw material gas different from that in step S102 is used. Step S103A is performed in the same manner as step S103.

As shown in Table 12 which will be described later, by repeatedly performing supplying a raw material gas containing an element X1 as the element X, supplying a raw material gas containing an element X2, which is different from the element X1, as the element X, and supplying a plasmarized reaction gas, the third film W3, which is an oxide film of the element X (specifically, the elements X1 and X2), may be selectively formed on the second film W2 with respect to the first film W1. One of the element X1 and the element X2 is a metal element (specifically, a transition metal element) and the other one is a semiconductor element. By performing both steps S102 and S102A, crystallization of the third film W3 can be suppressed, so that flatness of the third film W3 can be improved.

Although the element X1 is a metal element and the element X2 is a semiconductor element in Table 12, the element X1 may be a semiconductor element and the element X2 may be a metal element. Further, the combination of the element X1 and the element X2 may be a combination of metal elements or a combination of semiconductor elements. The element X may include an element X3 different from the elements X1 and X2, or may include three or more elements different from one another. The controller 100 may also supply a raw material gas containing the element X3.

Further, as shown in Table 13 which will be described later, steps S102A to S105A may be performed after performing steps S102 to S105 n times (n is any natural number from one to N) and before performing steps S102 to S105 (n+1) times. Step S102A is performed in the same manner as step S102 except that a raw material gas different from that in step S102 is used. Steps S103A to S105A are performed in the same manner as steps S103 to S105, respectively.

As shown in Table 13 which will be described later, by repeatedly performing supplying a raw material gas containing an element X1 as the element X, supplying a plasmarized reaction gas, supplying a raw material gas containing an element X2, which is different from the element X1, as the element X, and supplying a plasmarized reaction gas, the third film W3, which is an oxide film of the element X (specifically, the elements X1 and X2), may be selectively formed on the second film W2 with respect to the first film W1. One of the element X1 and the element X2 is a metal element (specifically a transition metal element) and the other one is a semiconductor element. By performing both steps S102 and S102A, crystallization of the third film W3 can be suppressed, so that flatness of the third film W3 can be improved.

Although the element X1 is a metal element and the element X2 is a semiconductor element in Table 13, the element X1 may be a semiconductor element and the element X2 may be a metal element. Further, the combination of the element X1 and the element X2 may be a combination of metal elements or a combination of semiconductor elements. The element X may include an element X3 different from the elements X1 and X2, or may include three or more elements different from one another. The controller 100 may also supply a raw material gas containing the element X3.

EXAMPLES

Next, Examples and the like will be described. Cases 1, 5, and 9 to 17 to be described below are Examples, and Cases 2 to 4 and 6 to 8 to be described below are Comparative Examples.

[Case 1]

Figure 12:
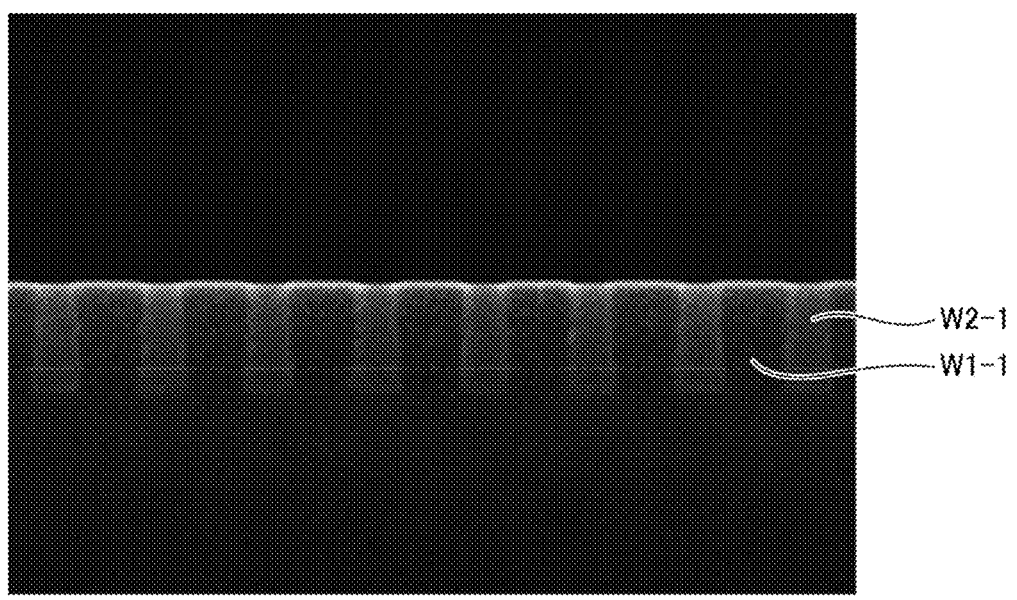
FIG. 12 is an SEM photograph showing a substrate before being subjected to a process of Case 1.

In Case 1, a substrate having a surface of a B film W1-1 and a surface of a SiO film W2-1 on the same plane, as shown in FIG. 12, was prepared, and steps S102 to S105 of FIG. 1 were performed under process conditions shown in Table 1.

TABLE 1

| | Step | Time [sec] | Supplied gas | RF | Temperature [degrees C.] | N |
|---|---|---|---|---|---|---|
| Case 1 | S102 | 0.5 | $TiCl_4 + Ar + O_2$ | OFF | 350 | 200 |
| | S103 | 1.0 | $Ar + O_2$ | OFF | | |
| | S104 | 0.4 | $Ar + O_2$ | ON | | |
| | S105 | 0.1 | $Ar + O_2$ | OFF | | |

In Table 1, "ON" of "RF" means a gas was plasmarized by radio frequency power. "OFF" of "RF" means not plasmarizing a gas. The same applies to Tables 2, 3, 5, 7, 8, and 10 to 16 to be described below.

Figure 13:
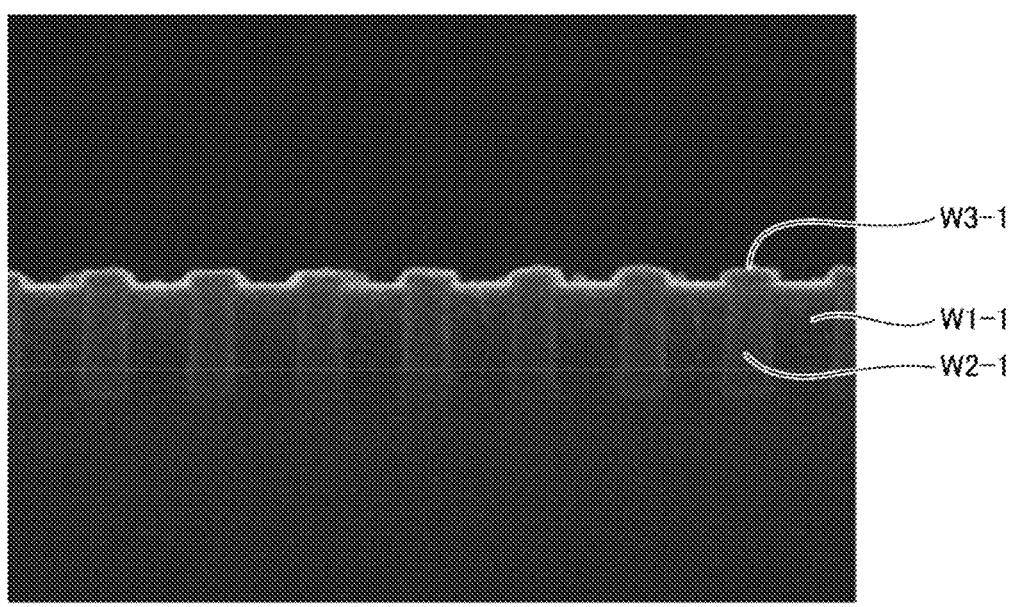
FIG. 13 is an SEM photograph showing a substrate after being subjected to the process of Case 1.

As shown in Table 1, in Case 1, $TiCl_4$ gas and plasmarized $O_2$ gas were alternately supplied to the substrate surface by a plasma ALD method. As a result, as shown in FIG. 13, a TiO film W3-1 was selectively formed on the SiO film W2-1 with respect to the B film W1-1.

[Cases 2 to 4]

In Cases 2 to 4, substrates having the same structure as in FIG. 12 were prepared and TiO films were formed by a thermal ALD, a thermal CVD method, and a plasma CVD method, respectively, but in all Cases 2 to 4, the TiO films were formed over the entire substrate surfaces.

In Case 2, the substrate heated to 350 degrees C. was alternately supplied with $TiCl_4$ gas and non-plasmarized $H_2O$ gas 300 times each by the thermal ALD method.

In Case 3, the substrate heated to 350 degrees C. was simultaneously supplied with $TiCl_4$ gas and non-plasmarized $O_3$ gas) by the thermal CVD method.

In Case 4, the substrate heated to 350 degrees C. was simultaneously supplied with $TiCl_4$ gas and plasmarized $O_2$ gas by the plasma CVD method.

Comparing Case 1 with Cases 2 to 4, it can be recognized that it is important to use a plasma ALD method in order to selectively form a TiO film on a SiO film with respect to a B film.

[Case 5]

Figure 33:
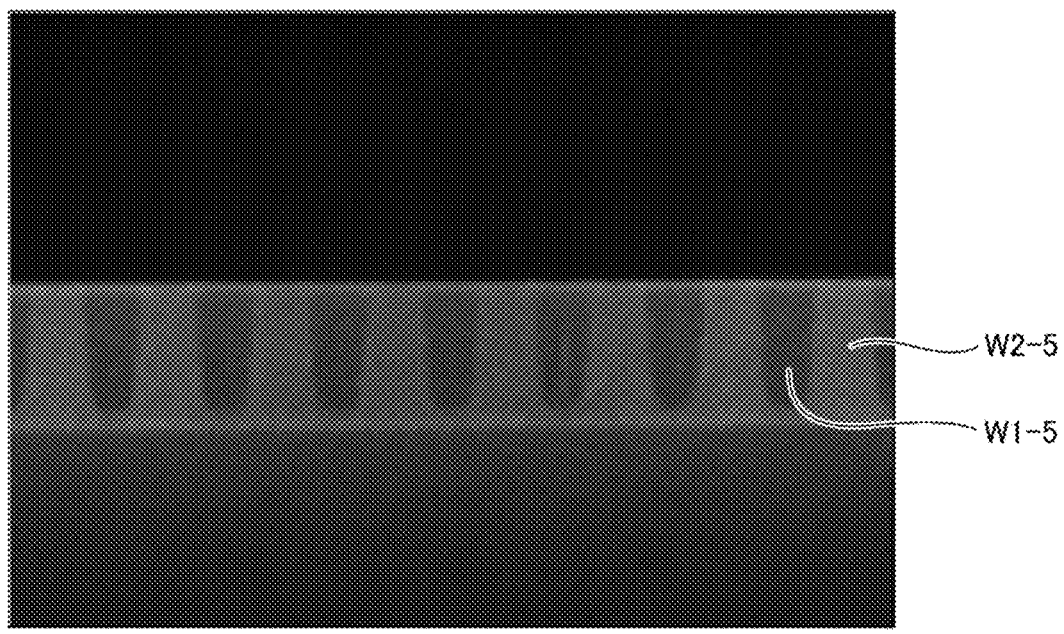
FIG. 33 is an SEM photograph showing a substrate before being subjected to a process of Case 5.

In Case 5, a substrate having a surface of a BN film W1-5 and a surface of a SiO film W2-5 on the same plane was prepared, as shown in FIG. 33, and a process of FIG. 32 was performed under process conditions shown in Table 2.

TABLE 2

| | Step | Time [sec] | Supplied gas | RF | Temperature [degrees C.] | N |
|---|---|---|---|---|---|---|
| Case 5 | S102 | 2 | $TiCl_4 + Ar$ | OFF | 400 | 300 |
| | S103 | 1 | Ar | OFF | | |
| | S109 | 5 | $O_3 + O_2 + Ar + N_2$ | OFF | | |
| | S105 | 1 | Ar | OFF | | |

Figure 34:
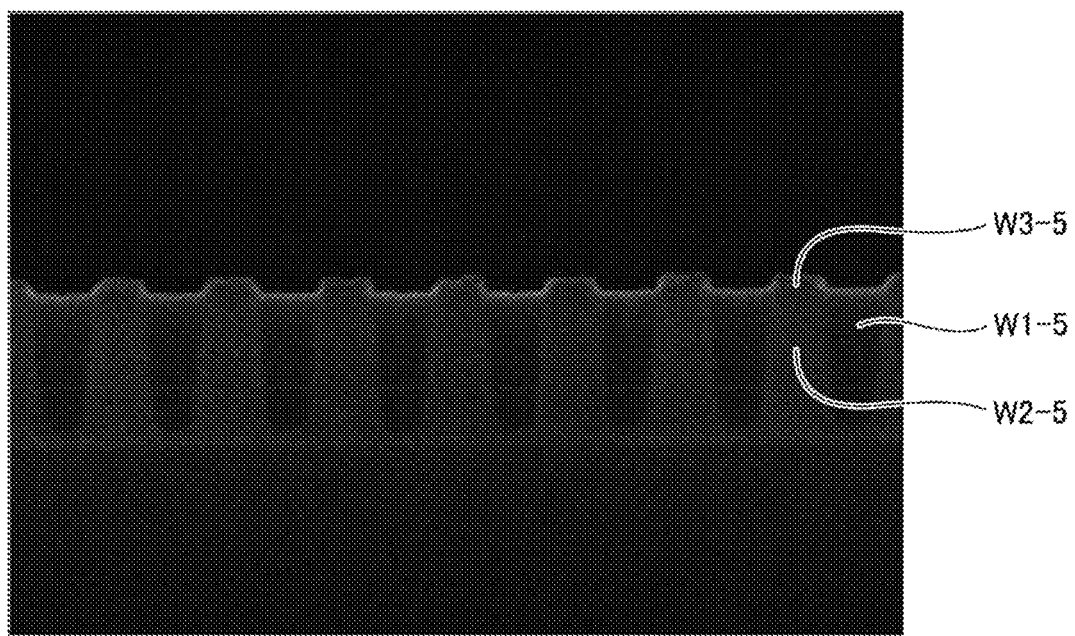
FIG. 34 is an SEM photograph showing a substrate after being subjected to the process of Case 5.

As shown in Table 2, in Case 5, the substrate surface heated to 400 degrees C. was alternately supplied with $TiCl_4$ gas and non-plasmarized $O_3$ gas) 300 times each by a thermal ALD method. As a result, as shown in FIG. 34, a TiO film W3-5 was selectively formed on the SiO film W2-5 with respect to the BN film W1-5.

[Cases 6 to 8]

In Case 6, a substrate having the same structure as in FIG. 12 was prepared and a Ti film was formed by a plasma ALD method, but the Ti film was formed over the entire substrate surface. In the plasma ALD method of Case 6, the substrate heated to 350 degrees C. was alternately supplied with $TiCl_4$ gas and plasmarized $H_2$ gas.

In Case 7, a substrate having the same structure as in FIG. 12 was prepared and a TiN film was formed by a plasma ALD method, but the TiN film was formed over the entire substrate surface. In the plasma ALD method of Case 7, the substrate heated to 350 degrees C. was alternately supplied with $TiCl_4$ gas and plasmarized $NH_3$ gas.

In Case 8, a substrate having the same structure as in FIG. 12 was prepared and a TiN film was formed by a thermal ALD method, but the TiN film was formed over the entire substrate surface. In the plasma ALD method of Case 8, the substrate heated to 250° C. was alternately supplied with TDMAT ($Ti[N(CH_3)_2]_4$) gas and non-plasmarized $NH_3$ gas.

Comparing Case 1 with Cases 6 to 8, it can be recognized that it is important to plasmarize a reaction gas containing oxygen and form an oxide film in order to selectively form a Ti-containing film on a SiO film with respect to a B film.

[Case 9]

Figure 14:
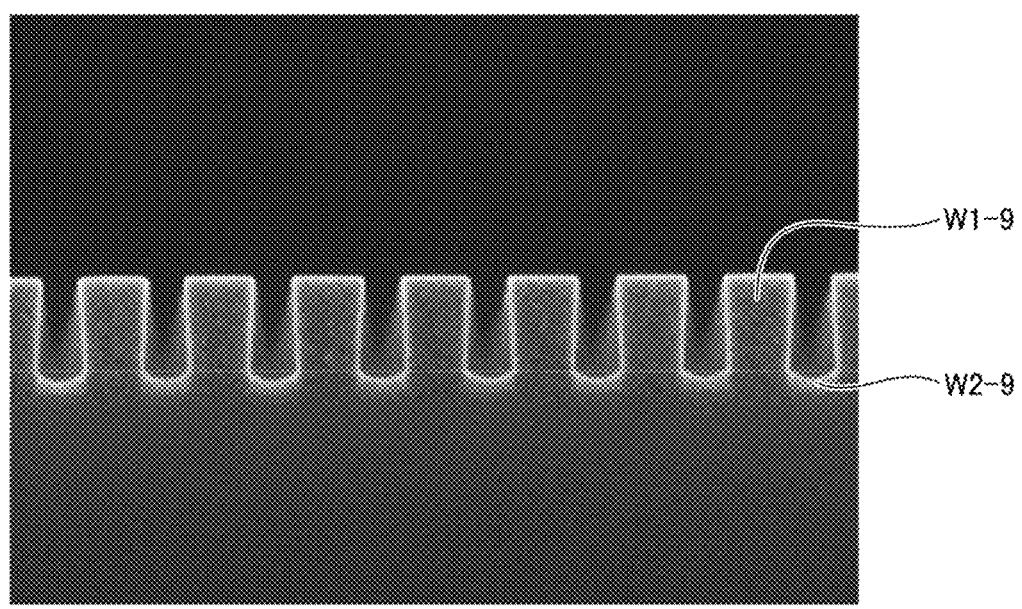
FIG. 14 is an SEM photograph showing a substrate before being subjected to a process of Case 9.

In Case 9, as shown in FIG. 14, a substrate in which recesses were formed in portions of a surface of a B film W1-9 and a SiO film W2-9 was exposed only on bottom surfaces of the recesses was prepared, and steps S102 to S105 of FIG. 1 were performed under process conditions shown in Table 3.

TABLE 3

| | Step | Time [sec] | Supplied gas | RF | Temperature [degrees C.] | N |
|---|---|---|---|---|---|---|
| Case 9 | S102 | 0.5 | $TiCl_4 + Ar + O_2$ | OFF | 350 | 1,000 |
| | S103 | 1.0 | $Ar + O_2$ | OFF | | |
| | S104 | 0.4 | $Ar + O_2$ | ON | | |
| | S105 | 0.1 | $Ar + O_2$ | OFF | | |

Figure 15:
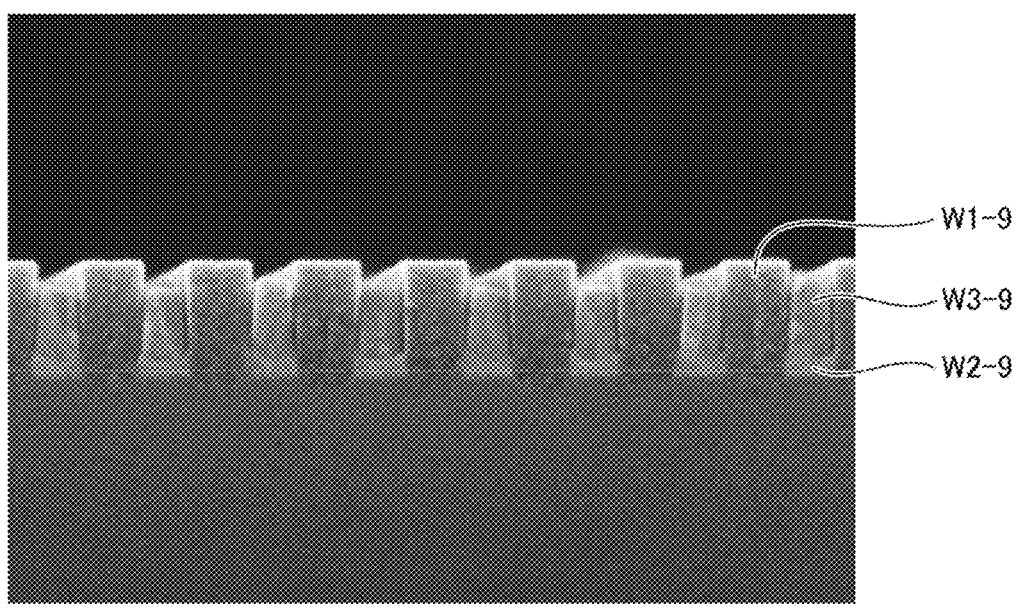
FIG. 15 is an SEM photograph showing a substrate after being subjected to the process of Case 9.

As shown in Table 3, in Case 9, $TiCl_4$ gas and plasmarized $O_2$ gas were alternately supplied to the substrate surface. As a result, as shown in FIG. 15, the inside of the recesses of the B film W1-9 were selectively filled with a TiO film W3-9.

[Case 10]

In Case 10, steps S102 to S105 of FIG. 1 were performed under process conditions shown in Table 5 with respect to various base films shown in Table 4. Thereafter, thicknesses of TiO films formed on the various base films were measured. Table 4 shows the measurement results of the thicknesses. In Table 4, "c-Si" is crystallized silicon.

TABLE 4

| Base film | Thickness of third film (TiO film) [nm] |
|---|---|
| B | 0.0 |
| BN | 0.0 |
| c-Si | 13.2 |
| $SiO_2$ | 13.9 |
| SiN | 13.2 |
| $Al_2O_3$ | 23.8 |
| W | 21.8 |
| TiN | 13.4 |
| Mo | 12.1 |
| Ru | 16.9 |

TABLE 5

| | Step | Time [sec] | Supplied gas | RF | Temperature [degrees C.] | N |
|---|---|---|---|---|---|---|
| Case 10 | S102 | 0.5 | $TiCl_4 + Ar + O_2$ | OFF | 300 | 300 |
| | S103 | 1.0 | $Ar + O_2$ | OFF | | |
| | S104 | 0.4 | $Ar + O_2$ | ON | | |
| | S105 | 0.1 | $Ar + O_2$ | OFF | | |

As is clear from Table 4, no TiO film was formed on the B-containing films, whereas the TiO film was formed on the films containing substantially no B. A similar tendency was observed under process conditions in which N in step S106 exceeded 1,000 times.

[Case 11]

In Case 11, steps S201 to S205 of FIG. 9 were performed under process conditions shown in Table 7 with respect to various base films shown in Table 6, and then steps S102 to S106 of FIG. 1 were performed under process conditions shown in Table 8. Thereafter, thicknesses of third films (TiO films) formed on the various base films were measured. Table 6 shows the measurement results of the thicknesses.

TABLE 6

| Base film | Thickness of third film (TiO film) [nm] |
|---|---|
| $SiO_2$ | 14.6 |
| $TiO_2$ | 0.0 |
| Mo | 19.5 |
| Ru | 0.0 |

TABLE 7

| | Step | Time [sec] | Supplied gas | RF | Temperature [degrees C.] | M |
|---|---|---|---|---|---|---|
| Case 11 | S201 | 0.5 | $TDMAB + Ar + NH_3$ | OFF | 130 | 300 |
| | S202 | 1.0 | $Ar + NH_3$ | OFF | | |
| | S203 | 2.0 | $Ar + NH_3$ | ON | | |
| | S204 | 0.1 | $Ar + NH_3$ | OFF | | |

TABLE 8

| | Step | Time [sec] | Supplied gas | RF | Temperature [degrees C.] | N |
|---|---|---|---|---|---|---|
| Case 11 | S102 | 0.5 | $TiCl_4 + Ar + O_2$ | OFF | 350 | 300 |
| | S103 | 1.0 | $Ar + O_2$ | OFF | | |
| | S104 | 0.4 | $Ar + O_2$ | ON | | |
| | S105 | 0.1 | $Ar + O_2$ | OFF | | |

As is clear from Table 6, no third film (TiO film) was formed on the $TiO_2$ film and the Ru film, whereas the third film (TiO film) was formed on the $SiO_2$ film and the Mo film. Comparing Tables 4 and 6, it is thought that a BN film was formed on the $TiO_2$ film and the Ru film, and no BN film was formed on the $SiO_2$ film and the Mo film. A similar tendency was observed under process conditions in which N in step S106 exceeded 1,000 times.

[Case 12]

In Case 12, steps S201 to S205 of FIG. 9 were performed under process conditions shown in Table 10 with respect to various base films shown in Table 9, and then steps S102 to S106 of FIG. 1 were performed under process conditions shown in Table 11. Thereafter, thicknesses of third films (TiO films) formed on the various base films were measured. Table 9 shows the measurement results of the thicknesses.

TABLE 9

| Base film | Thickness of third film (TiO film) [nm] |
|---|---|
| $SiO_2$ | 0.0 |
| $TiO_2$ | 17.8 |
| Mo | 20.3 |
| Ru | 10.0 |

TABLE 10

| | Step | Time [sec] | Supplied gas | RF | Temperature [degrees C.] | M |
|---|---|---|---|---|---|---|
| Case 12 | S201 | 0.5 | $TDMAB + Ar + N_2 + H_2$ | OFF | 170 | 300 |
| | S202 | 1.0 | $Ar + N_2 + H_2$ | OFF | | |
| | S203 | 2.0 | $Ar + N_2 + H_2$ | ON | | |
| | S204 | 0.1 | $Ar + N_2 + H_2$ | OFF | | |

TABLE 11

| | Step | Time [sec] | Supplied gas | RF | Temperature [degrees C.] | N |
|---|---|---|---|---|---|---|
| Case 12 | S102 | 0.5 | TiCl$_4$ + Ar + O$_2$ | OFF | 350 | 300 |
| | S103 | 1.0 | Ar + O$_2$ | OFF | | |
| | S104 | 0.4 | Ar + O$_2$ | ON | | |
| | S105 | 0.1 | Ar + O$_2$ | OFF | | |

As is clear from Table 9, no third film (TiO film) was formed on the SiO$_2$ film, whereas the third film (TiO film) was formed on the TiO$_2$ film, the Mo film, and the Ru film. Comparing Tables 4 and 9, it is thought that a BN film was formed on the SiO$_2$ film, and no BN film was formed on the TiO$_2$ film, the Mo film, and the Ru film. A similar tendency was observed under process conditions in which N in step S106 exceeded 1,000 times. It is thought that the reason why the film type of the base film on which the BN film is formed is different between Case 11 and Case 12 is mainly because the type of gas plasmarized in step S203 is different. In step S203 of Case 11, NH$_3$ gas was used as shown in Table 7, whereas in step S203 of Case 12, a mixture of N$_2$ gas and H$_2$ gas was used as shown in Table 10.

[Case 13]

Figure 16:
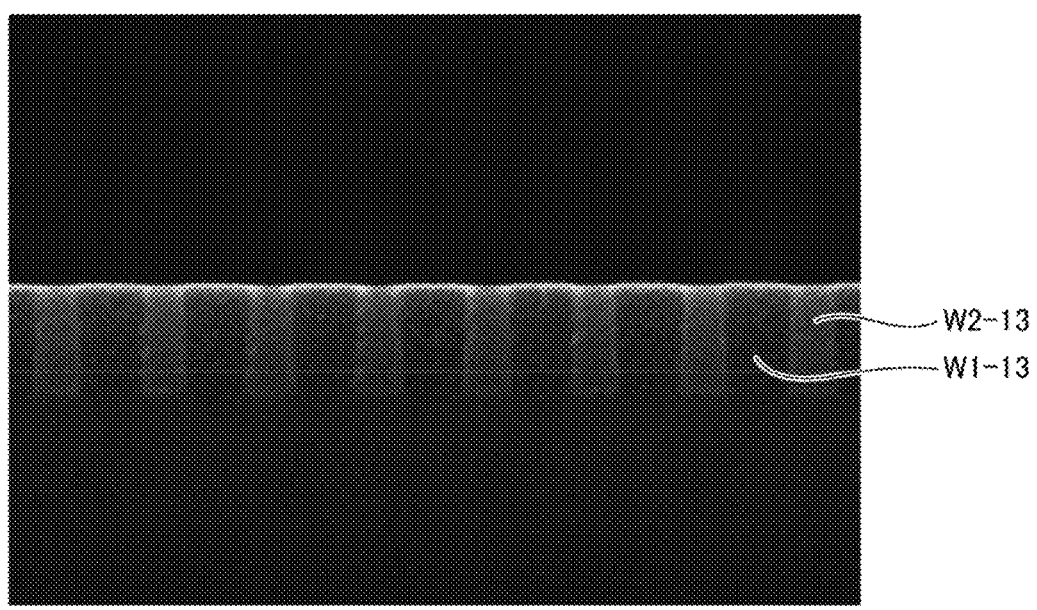
FIG. 16 is an SEM photograph showing a substrate before being subjected to a process of Case 13.

In Case 13, as shown in FIG. 16, a substrate having a surface of a B film W1-13 and a surface of a SiO film W2-13 on the same plane was prepared, and steps S102 to S105 of FIG. 1 were performed under process conditions shown in Table 12. Further, in Case 13, as shown in Table 12, steps S102A and S103A were performed after step S103 and before step S104.

TABLE 12

| | Step | Time [sec] | Supplied gas | RF | Temperature [degrees C.] | N |
|---|---|---|---|---|---|---|
| Case 13 | S102 | 0.5 | TiCl$_4$ + Ar + O$_2$ | OFF | 350 | 300 |
| | S103 | 1.0 | Ar + O$_2$ | OFF | | |
| | S102A | 0.5 | SiCl$_4$ + Ar + O$_2$ | OFF | | |
| | S103A | 1.0 | Ar + O$_2$ | OFF | | |
| | S104 | 0.4 | Ar + O$_2$ | ON | | |
| | S105 | 0.1 | Ar + O$_2$ | OFF | | |

Figure 17:
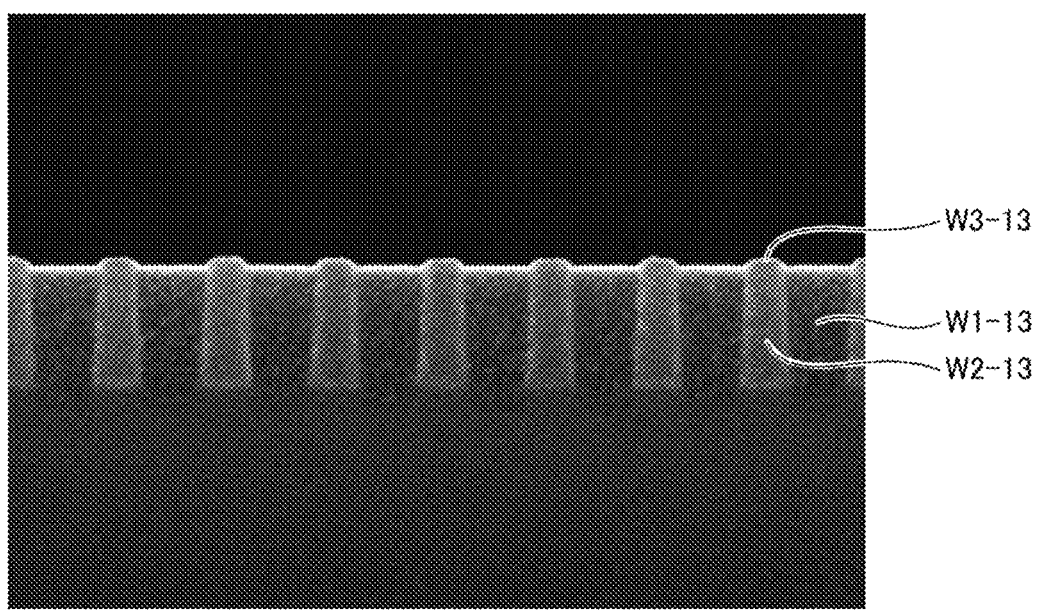
FIG. 17 is an SEM photograph showing a substrate after being subjected to the process of Case 13.

As shown in Table 12, in Case 13, TiCl$_4$ gas, SiCl$_4$ gas, and plasmarized O$_2$ gas were supplied to the substrate surface sequentially with repetition of N (N=300) times by a plasma ALD method. As a result, as shown in FIG. 17, a TiSiO film W3-13 was selectively formed on the SiO film W2-13 with respect to the B film W1-13.

[Case 14]

Figure 18:
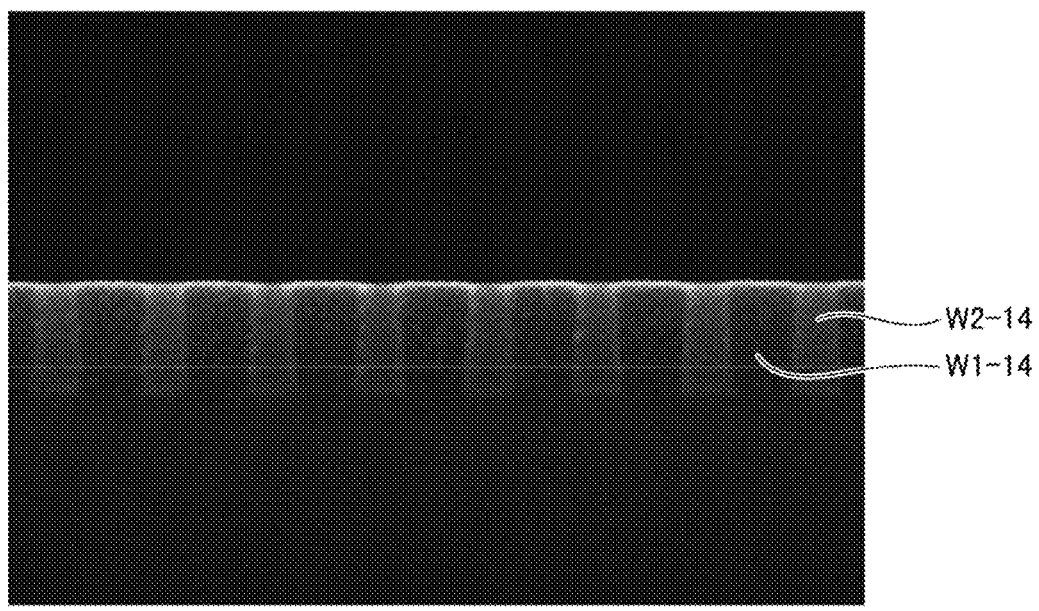
FIG. 18 is an SEM photograph showing a substrate before being subjected to a process of Case 14.

In Case 14, as shown in FIG. 18, a substrate having a surface of a B film W1-14 and a surface of a SiO film W2-14 on the same plane was prepared, and steps S102 to S105 of FIG. 1 were performed under process conditions shown in Table 13. Further, in Case 14, as shown in Table 13, step S102A to S105A were performed after steps S102 to S105 were performed n times (n is any natural number from one to N) and before steps S102 to S105 were performed (n+1) times.

TABLE 13

| | Step | Time [sec] | Supplied gas | RF | Temperature [degrees C.] | N |
|---|---|---|---|---|---|---|
| Case 14 | S102 | 0.5 | TiCl$_4$ + Ar + O$_2$ | OFF | 350 | 300 |
| | S103 | 1.0 | Ar + O$_2$ | OFF | | |
| | S104 | 0.4 | Ar + O$_2$ | ON | | |
| | S105 | 0.1 | Ar + O$_2$ | OFF | | |
| | S102A | 0.5 | SiCl$_4$ + Ar + O$_2$ | OFF | | |
| | S103A | 1.0 | Ar + O$_2$ | OFF | | |
| | S104A | 0.4 | Ar + O$_2$ | ON | | |
| | S105A | 0.1 | Ar + O$_2$ | OFF | | |

Figure 19:
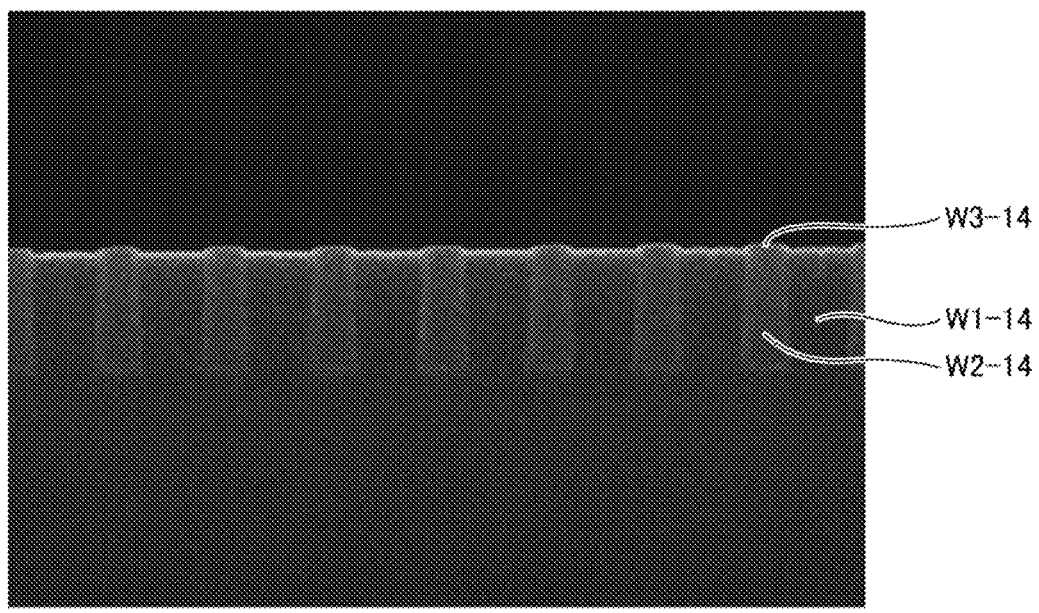
FIG. 19 is an SEM photograph showing a substrate after being subjected to the process of Case 14.

As shown in Table 13, in Case 14, TiCl$_4$ gas, plasmarized O$_2$ gas, SiCl$_4$ gas, and plasmarized O$_2$ gas were supplied to the substrate surface sequentially with repetition of N (N=300) times by a plasma ALD method. As a result, as shown in FIG. 19, a TiSiO film W3-14 was selectively formed on the SiO film W2-14 with respect to the B film W1-14.

[Case 15]

Figure 26:
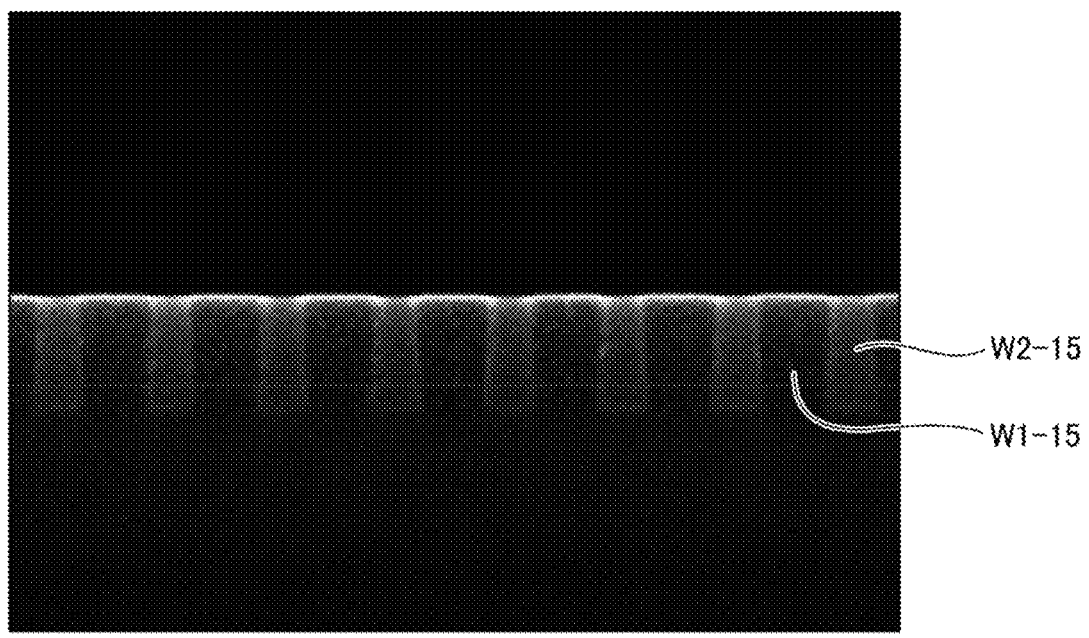
FIG. 26 is an SEM photograph showing a substrate before being subjected to a process of Case 15.

In Case 15, as shown in FIG. 26, a substrate having a surface of a B film W1-15 and a surface of a SiO film W2-15 on the same plane was prepared, and steps S102 to S105 of FIG. 1 were performed under process conditions shown in Table 14.

TABLE 14

| | Step | Time [sec] | Supplied gas | RF | Temperature [degrees C.] | M |
|---|---|---|---|---|---|---|
| Case 15 | S102 | 5 | Si$_2$Cl$_6$ + Ar | OFF | 300 | 300 |
| | S103 | 6 | Ar + O$_2$ | OFF | | |
| | S104 | 1 | Ar + O$_2$ | ON | | |
| | S105 | 6 | Ar | OFF | | |

Figure 27:
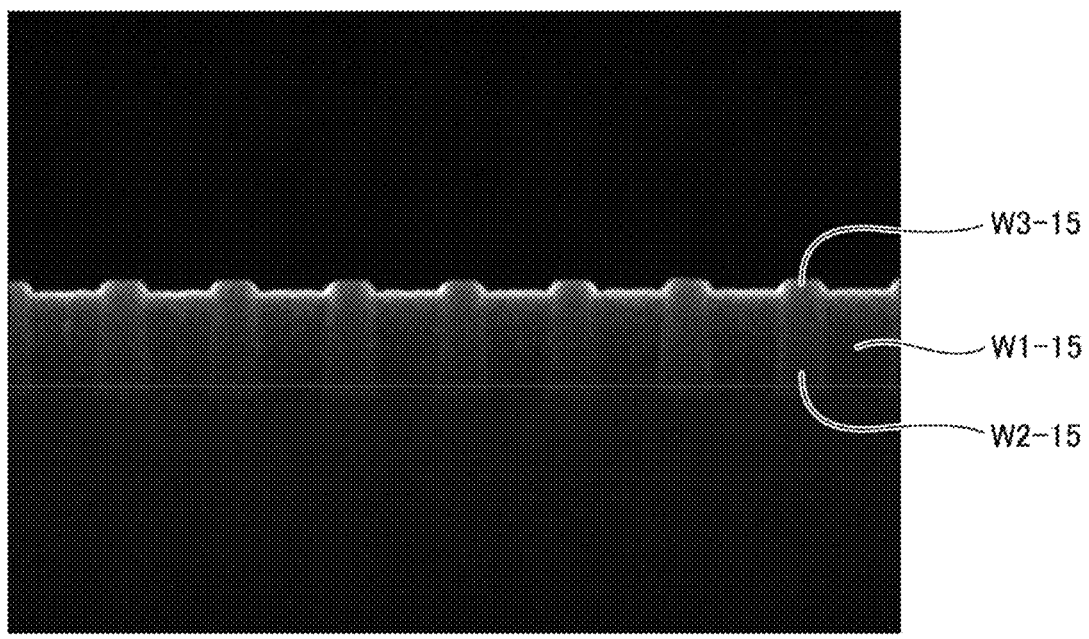
FIG. 27 is an SEM photograph showing a substrate after being subjected to the process of Case 15.

As shown in Table 14, in Case 15, Si$_2$Cl$_6$ gas and plasmarized O$_2$ gas were alternately supplied to the substrate surface by a plasma ALD method. As a result, as shown in FIG. 27, a SiO film W3-15 was selectively formed on the SiO film W2-15 with respect to the B film W1-15.

[Case 16]

Figure 28:
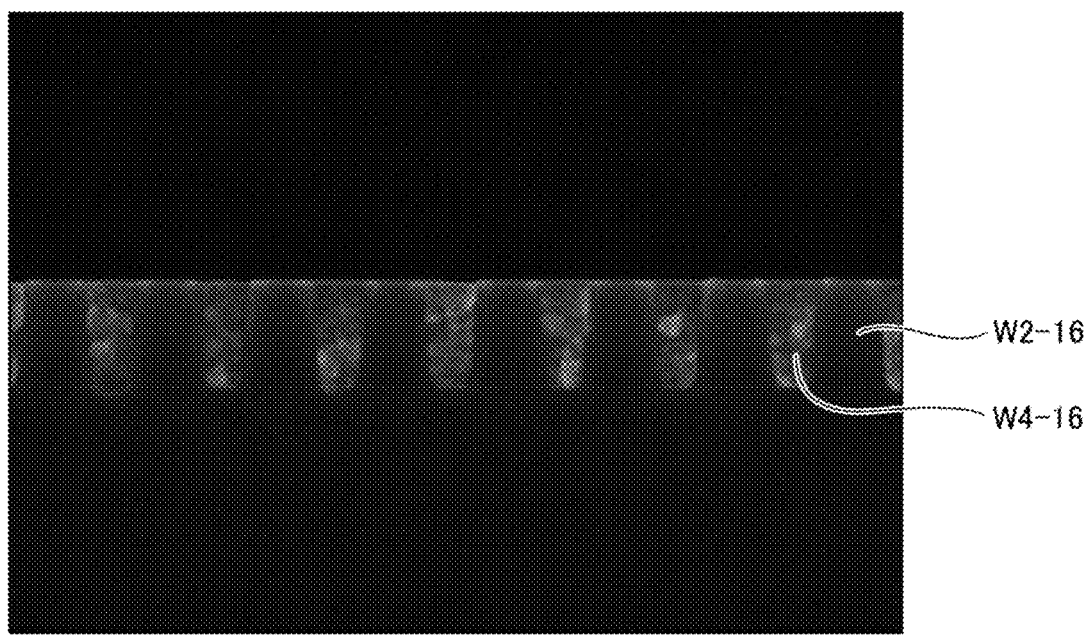
FIG. 28 is an SEM photograph showing a substrate before being subjected to a process of Case 16.

In Case 16, as shown in FIG. 28, a substrate having a surface of a Ru film W4-16 and a surface of a SiO film W2-16 on the same plane was prepared, and steps S201, S203, S204, and S102 to S105 of FIG. 20 were performed under process conditions shown in Table 15.

TABLE 15

| | Step | Time [sec] | Supplied gas | RF | Temperature [degrees C.] | M, N, K | |
|---|---|---|---|---|---|---|---|
| Case 16 | S201 | 1.0 | TDMAB + Ar + NH$_3$ | OFF | 300 | M = 1 | K = 1 |
| | S203 | 10 | TDMAB + Ar + NH$_3$ | ON | | | |
| | S204 | 50 | Ar | OFF | | | |
| | S102 | 0.5 | TiCl$_4$ + Ar + O$_2$ | OFF | 300 | N = 300 | |
| | S103 | 1.0 | Ar + O$_2$ | OFF | | | |
| | S104 | 0.4 | Ar + O$_2$ | ON | | | |
| | S105 | 0.1 | Ar + O$_2$ | OFF | | | |

Figure 29:
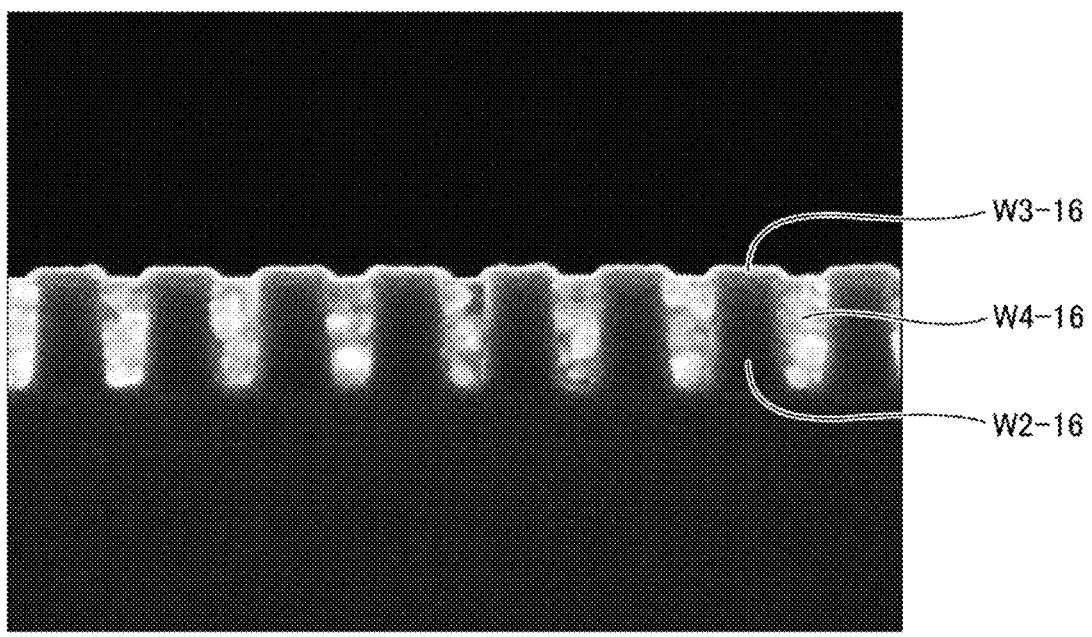
FIG. 29 is an SEM photograph showing a substrate after being subjected to the process of Case 16.

As a result, in Case 16, as shown in FIG. 29, a TiO film W3-16 was selectively formed on the SiO film W2-16 with respect to the Ru film W4-16. It is thought that the reason is because a BN film was formed on the Ru film W4-16 and no BN film was formed on the SiO film W2-16. The results of Case 16 are consistent with the results of Case 11 (see Table 6).

[Case 17]

Figure 30:
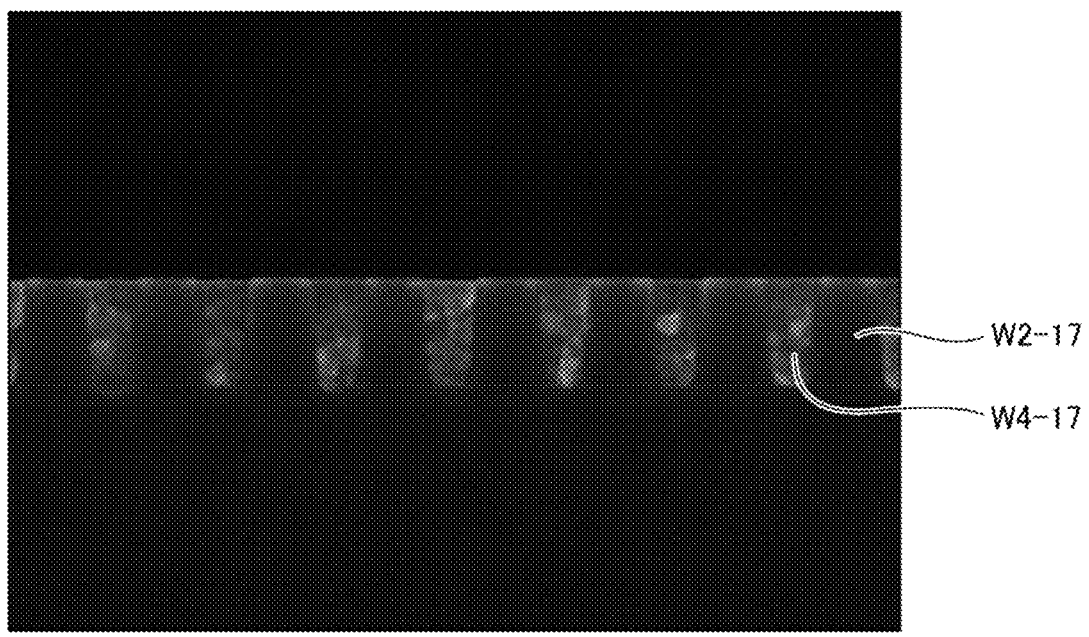
FIG. 30 is an SEM photograph showing a substrate before being subjected to a process of Case 17.

In Case 17, as shown in FIG. 30, a substrate having a surface of a Ru film W4-17 and a surface of a SiO film W2-17 on the same plane was prepared, and steps S201 to S204 and S102 to S105 of FIG. 20 were performed under process conditions shown in Table 16.

TABLE 16

| | Step | Time [sec] | Supplied gas | RF | Temperature [degrees C.] | M, N, K | | |
|---|---|---|---|---|---|---|---|---|
| Case 17 | S201 | 1.0 | TDMAB + Ar + $H_2$ | OFF | 200 | M = 1 | | K = 300 |
| | S202 | 1.0 | Ar + $H_2$ | OFF | | | | |
| | S203 | 1.0 | Ar + $H_2$ | ON | | | | |
| | S204 | 0.1 | Ar + $H_2$ | OFF | | | | |
| | S102 | 0.5 | $TiCl_4$ + Ar + $O_2$ | OFF | 200 | | N = 1 | |
| | S103 | 1.0 | Ar + $O_2$ | OFF | | | | |
| | S104 | 0.4 | Ar + $O_2$ | ON | | | | |
| | S105 | 0.1 | Ar + $O_2$ | OFF | | | | |

Figure 31:
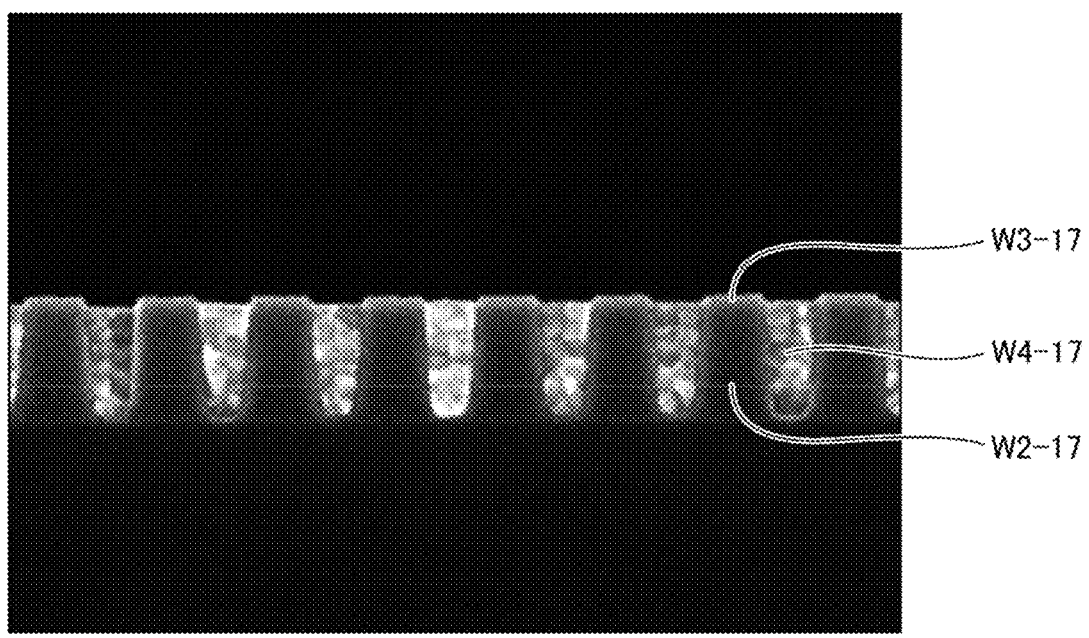
FIG. 31 is an SEM photograph showing a substrate after being subjected to the process of Case 17.

As a result, in Case 17, as shown in FIG. 31, a TiO film W3-17 was selectively formed on the SiO film W2-17 with respect to the Ru film W4-17. It is thought that the reason is because a B film was formed on the Ru film W4-17 and no B film was formed on the SiO film W2-17.

According to the present disclosure in some embodiments, it is possible to selectively form an oxide film on a second film, which is made of a material different from that of a first film containing boron, with respect to the first film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
   preparing a substrate having a surface on which a first film containing boron and a second film made of a material different from that of the first film are formed;
   supplying a raw material gas, which contains halogen and an element X other than halogen, to the surface of the substrate; and
   supplying a plasmarized reaction gas, which contains oxygen, to the surface of the substrate,
   wherein a third film as an oxide film of the element X is selectively formed on the second film with respect to the first film by alternately supplying the raw material gas and the plasmarized reaction gas.

2. The film forming method of claim 1, wherein the second film contains substantially no boron.

3. The film forming method of claim 1, wherein the preparing the substrate includes selectively forming the first film on a fourth film, which is made of a material different from that of the second film, with respect to the second film.

4. The film forming method of claim 3, further comprising the following sequential steps:
   preparing the substrate having the surface on which the second film and the fourth film are formed;
   selectively forming the first film on the fourth film with respect to the second film;
   selectively forming the third film on the second film with respect to the first film;
   selectively forming the first film again on the fourth film or the first film with respect to the third film; and
   selectively forming the third film again on the third film with respect to the first film.

5. The film forming method of claim 1, wherein the prepared substrate has a recess on the surface of the substrate, the first film is exposed only inside the recess, and the first film is exposed at least on a bottom surface of the recess.

6. The film forming method of claim 1, wherein the prepared substrate has a recess on the surface of the substrate, the second film is exposed only inside the recess, and the second film is exposed at least on a bottom surface of the recess.

7. The film forming method of claim 1, wherein the element X includes a metal element.

8. The film forming method of claim 1, wherein the element X includes a transition metal element.

9. The film forming method of claim 1, wherein the element X includes a semiconductor element.

10. The film forming method of claim 1, wherein the supplying the raw material gas includes supplying a raw material gas containing an element X1 as the element X and supplying a raw material gas containing an element X2, which is different from the element X1, as the element X, and
   wherein the third film as the oxide film of the element X is selectively formed on the second film with respect to the first film by repeatedly supplying the raw material gas containing the element X1, the raw material gas containing the element X2, and the plasmarized reaction gas.

11. The film forming method of claim 10, wherein one of the element X1 and the element X2 is a metal element, and the other one is a semiconductor element.

12. The film forming method of claim 1, wherein the supplying the raw material gas includes supplying a raw material gas containing an element X1 as the element X and supplying a raw material gas containing an element X2, which is different from the element X1, as the element X, and
   wherein the third film as the oxide film of the element X is selectively formed on the second film with respect to the first film by repeatedly supplying the raw material gas containing the element X1, the plasmarized reaction gas, the raw material gas containing the element X2, and the plasmarized reaction gas.

13. The film forming method of claim 1, wherein the element X includes three or more elements different from one another.

14. The film forming method of claim 1, wherein the supply of the raw material gas and the supply of the plasmarized reaction gas are alternately performed at a temperature of 100 degrees C. to 800 degrees C.

15. A film forming method comprising:
preparing a substrate having a surface on which a first film containing boron and a second film made of a material different from that of the first film are formed;
supplying a raw material gas, which contains halogen and an element X other than halogen, to the surface of the substrate; and
supplying non-plasmarized $O_3$ gas) to the surface of the substrate,
wherein a third film as an oxide film of the element X is selectively formed on the second film with respect to the first film by alternately supplying the raw material gas and the $O_3$ gas).

16. The film forming method of claim 15, wherein the second film contains substantially no boron.

17. The film forming method of claim 15, wherein the preparing the substrate includes selectively forming the first film on a fourth film, which is made of a material different from that of the second film, with respect to the second film.

18. The film forming method of claim 17, further comprising the following sequential steps:
preparing the substrate having the surface on which the second film and the fourth film are formed;
selectively forming the first film on the fourth film with respect to the second film;
selectively forming the third film on the second film with respect to the first film;
selectively forming the first film again on the fourth film or the first film with respect to the third film; and
selectively forming the third film again on the third film with respect to the first film.

19. The film forming method of claim 15, wherein the prepared substrate has a recess on the surface of the substrate, the first film is exposed only inside the recess, and the first film is exposed at least on a bottom surface of the recess.

20. The film forming method of claim 15, wherein the prepared substrate has a recess on the surface of the substrate, the second film is exposed only inside the recess, and the second film is exposed at least on a bottom surface of the recess.

21. The film forming method of claim 15, wherein the supplying the raw material gas includes supplying a raw material gas containing an element X1 as the element X and supplying a raw material gas containing an element X2, which is different from the element X1, as the element X, and
wherein the third film as the oxide film of the element X is selectively formed on the second film with respect to the first film by repeatedly supplying the raw material gas containing the element X1, the raw material gas containing the element X2, and the $O_3$ gas).

22. The film forming method of claim 15, wherein the supplying the raw material gas includes supplying a raw material gas containing an element X1 as the element X and supplying a raw material gas containing an element X2, which is different from the element X1, as the element X, and
wherein the third film as the oxide film of the element X is selectively formed on the second film with respect to the first film by repeatedly supplying the raw material gas containing the element X1, the $O_3$ gas), the raw material gas containing the element X2, and the $O_3$ gas).

23. The film forming method of claim 15, wherein the element X includes three or more elements different from one another.

24. The film forming method of claim 15, wherein the supply of the raw material gas and the supply of the $O_3$ gas) are alternately performed at a temperature of 100 degrees C. to 800 degrees C.

* * * * *